United States Patent [19]
Yukutake et al.

[11] Patent Number: 5,646,897
[45] Date of Patent: Jul. 8, 1997

[54] LOGIC GATE CIRCUIT AND PARALLEL BIT TEST CIRCUIT FOR SEMICONDUCTOR MEMORY DEVICES, CAPABLE OF OPERATION AT LOW POWER SOURCE LEVELS

[75] Inventors: Seigou Yukutake, Kodaira; Masahiro Iwamura, Hitachi; Kinya Mitsumoto, Tamamura-machi; Takashi Akioka, Akishima; Noboru Akiyama, Hitachinaka, all of Japan

[73] Assignee: Hitachi, Ltd., Tokyo, Japan

[21] Appl. No.: 426,384

[22] Filed: Apr. 21, 1995

[30] Foreign Application Priority Data

Apr. 27, 1994 [JP] Japan .................................. 6-089902
Jun. 3, 1994 [JP] Japan .................................. 6-122520

[51] Int. Cl.$^6$ ............................................ G11C 7/00
[52] U.S. Cl. .......................... 365/205; 365/175; 365/179; 365/189.06; 365/189.11; 326/51; 326/89
[58] Field of Search ..................... 365/189.06, 230.06, 365/189.11, 205, 179, 175; 326/89, 105, 51

[56] References Cited

U.S. PATENT DOCUMENTS 5,402,011 3/1995 Aoki ............................................ 327/65

OTHER PUBLICATIONS

"7ns 4Mb BICMOS SRAM with Parallel Testing Circuit" by Y. Okajima et al. 1991 IEEE International Solid State Circuits Conference.
Ronald J. Tocci: Digital System, Principle and Applications, pp. 403–404 and 438–440, Prentice Hall 1988.

Primary Examiner—David C. Nelms
Assistant Examiner—F. Niransan
Attorney, Agent, or Firm—Antonelli, Terry, Stout & Kraus, LLP

[57] ABSTRACT

A logic circuit is provided for a memory device which can be operated at a high speed with a lower voltage power source level than conventional devices. This logic circuit can be used in a multi-bit test circuit executing the wired-OR-logic operation of complementary logic signals from a plurality of pre-sense amplifiers, receiving the output of the wired-OR-logic operation by an emitter follower using a bipolar transistor, and outputting an AND signal of the complementary logic signals by a level comparing circuit. A sense amplifier is also provided for executing the wired-OR-logic operation of complementary logic signals from a plurality of pre-sense amplifiers, raising the level of the output of the wired-OR-logic operation by a level shift circuit having a semiconductor element for applying an inverse bias potential to an input signal, executing the wired-OR-operation of the shifted up output and outputs from other blocks, and receiving and amplifying the output of the wired-OR-logic operation.

19 Claims, 12 Drawing Sheets

| LOGICAL STATE OF FIRST LOGIC SIGNAL | LOGICAL STATE OF SECOND LOGIC SIGNAL | LOGICAL STATE OF AND LOGIC OUTPUT | LOGICAL STATE OF NAND LOGIC OUTPUT |
|---|---|---|---|
| L | L | L | H |
| L | H | L | H |
| H | H | H | L |
| H | L | L | H |

FIG. 4(a)
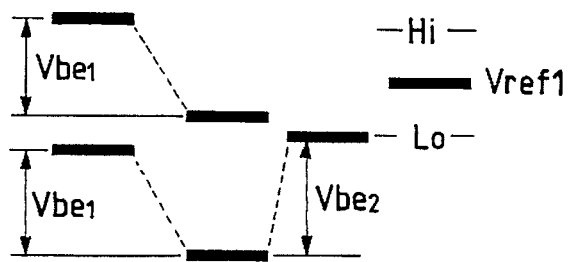
FIG. 4(b)
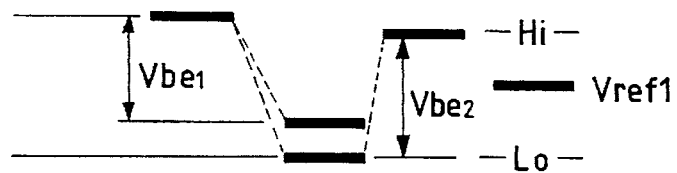
FIG. 5
| LOGICAL STATE OF SIGNAL ON COMMON DATA BUS LINE 15-1 | LOGICAL STATE OF SIGNAL ON COMMON DATA BUS LINE 15-2 | LOGICAL STATE OF LOGIC OUTPUT SIGNAL SENT TO FIRST OUTPUT TERMINAL 11-1 (AND LOGIC) | LOGICAL STATE OF LOGIC OUTPUT SIGNAL SENT TO SECOND OUTPUT TERMINAL 11-2 (NAND LOGIC) |
|---|---|---|---|
| L | H | L (ALL NORMAL) | H (ALL NORMAL) |
| H | L | L (ALL NORMAL) | H (ALL NORMAL) |
| H | H | H (SOME ONES ABNORMAL) | L (SOME ONES ABNORMAL) |

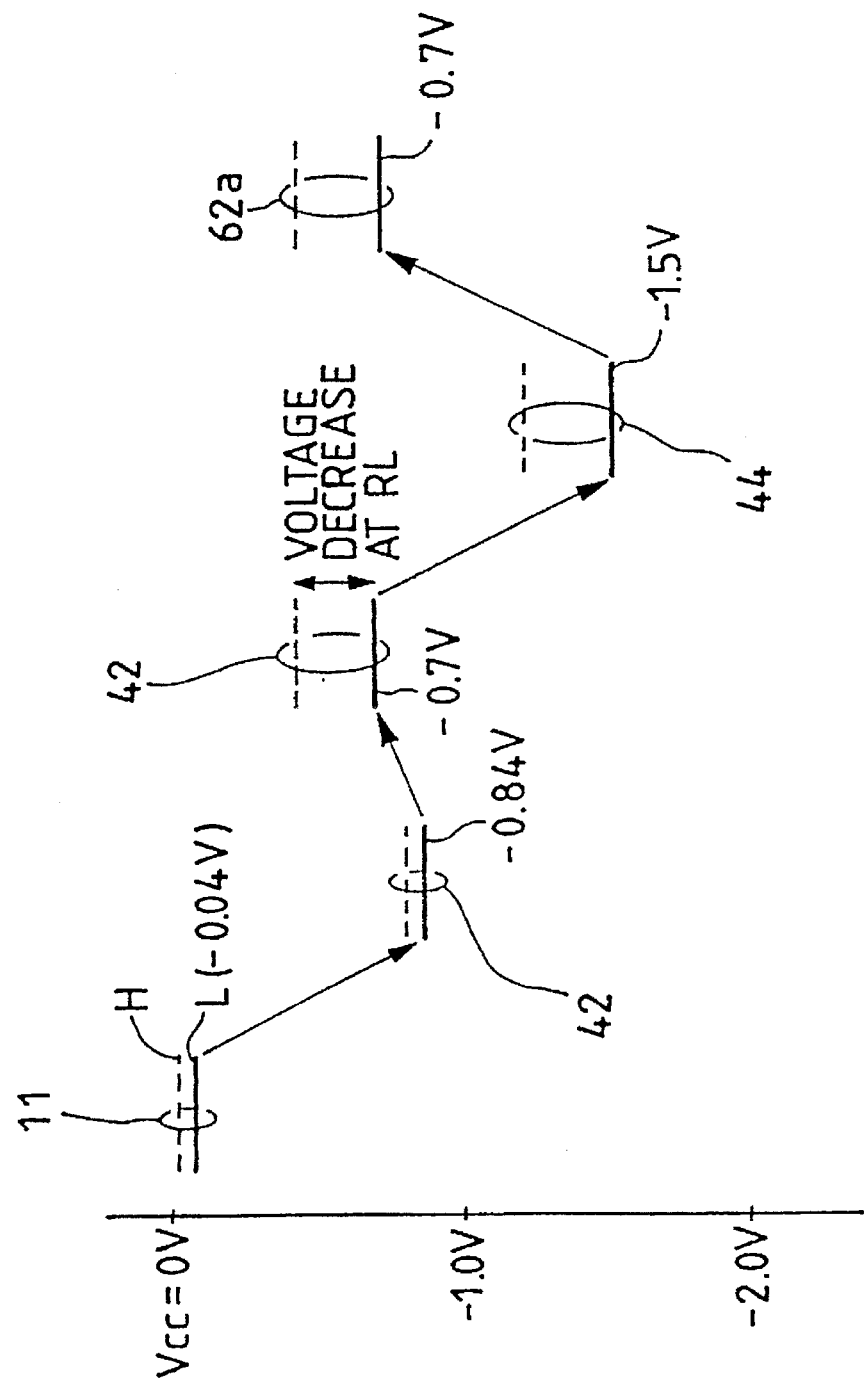

5,646,897

LOGIC GATE CIRCUIT AND PARALLEL BIT TEST CIRCUIT FOR SEMICONDUCTOR MEMORY DEVICES, CAPABLE OF OPERATION AT LOW POWER SOURCE LEVELS

BACKGROUND OF THE INVENTION

1. Field of the Invention

The present invention is used in a memory device and relates to a circuit for logic processing.

More specifically, the invention particularly relates to a memory circuit of a logic gate circuit increasing levels of input logic signals and providing AND (NAND) logic output of the input signals, being preferably used for a test circuit for executing parallel tests of a memory cell (multi-bit test).

Further, the invention particularly relates to a memory circuit of a sense circuit selecting and amplifying output data of a memory cell selected from plural memory cells corresponding to one line of an output data bus of a semiconductor memory device, in accordance with a read out address.

Furthermore, the invention particularly relates to a memory circuit having a sense circuit selecting output data, in accordance with a read out address, by processing a wired-OR operation of outputs of each of pre-sense amplifiers for amplifying outputs of each group of memory cells, all memory cells being divided into plural groups.

2. Description of the Related Art

Conventionally, for such a semiconductor memory device having a comparatively large memory capacity and high speed operation performance as an SRAM, BiCMOS-SRAM, etc., a test of data writing in and reading out is carried out for the whole group of memory cells in order to confirm the operations of all memory cells arranged in an array composition. Such a test does not need much time if a memory capacity of a semiconductor memory device is comparatively small. However, recently the memory capacity of a semiconductor memory devices, that is, the number of memory cells, has considerably increased, and the time required for the test has greatly increased. As such, the test becomes a much time consuming task.

On the other hand, parallel test circuits of memory cells (multi-bit test) have lately developed for solving the problem of increase of the test time, by executing the test for a group of memory cells in parallel.

In FIG. 8, an example of conventional parallel test circuits executing the multi-bit test is shown. The example conventional parallel test circuit has such a structure that the third ECL circuit 60 is put on the first and the second ECL circuits 58 and 59, as the test circuit 54 is viewed from the side of a power line. Then, if a voltage of the power source decreases, for example, near to 2.5 V, operational margins of the two bipolar transistors are lost, which causes such a problem that a correct XOR processing of input signals can not be executed and the parallel test (multi-bit test) becomes impossible.

In the following, the above-mentioned problem is explained more in detail. Signals sent in a pair of common data bus lines 51 are distributed and sent to the test circuit 54 and MSA 53 via a signal distributing circuit 52. Voltages of the distributed signals A and B to the test circuit 54 are reduced by 2× Vbe (where Vbe is a voltage decrease between a base and an emitter of a transistor) from a voltage of a higher side power source (Vcc). Then, since a voltage margin of 2× Vbe is needed for the two stages of the bipolar transistors and the voltage margin of Vs for the third ECL circuit 60, in the test circuit 54, the operational voltage of (4×Vbe+Vs) is totally required. If Vbe is 0.8 V and Vs is 0.4 V, then the needed operational voltage is 3.6 V (=0.8×4+ 0.4).

As mentioned above, if the voltage of a power source decreases near to 2.5 V in the parallel test circuit of memory cells, an correct XOR processing of input signals can not be executed, and consequently the parallel test of memory cells (multi-bit test) becomes impossible.

The above-mentioned point is true, but it is possible to provide only one stage of the emitter follower by reducing the number of the emitter followers to the input nodes of the test circuit 54, in the above-mentioned parallel test circuit of memory cells. However, even by using only one stage of the emitter follower, since the required operational voltage of the test circuit 54 is 2.8 V, a correct XOR processing of input signals can not be also executed, consequently the parallel test of memory cells (multi-bit test) becomes impossible if the voltage of a power source decreases near to 2.5 V.

Further, chip area has been is increasing according to the large increase of the memory capacity of a semiconductor memory device, and the wiring length in a chip, of a data bus for data reading out, becomes longer. Since a resistance R and a parasitic capacitance of the wiring in a chip increases in accordance with increase of the wiring length, the signal transmission delay by the wiring becomes larger, which impedes a high-speed data access.

Then, in order to decrease the parasitic capacitance by the data bus wiring of a sense circuit after a pre-sense amplifier, it is devised that an output signal of a collector node in a current switch of ECL (Emitter-Coupled Logic) included in a pre-sense amplifier is output to a data bus from an emitter node via an emitter follower (ISSCC, 91(SESSION 3/HIGH-SPEED RAM/PAPER WP 3.5)). Since the parasitic capacitance of a collector is considerably smaller than that of an emitter, which is clear from the structure of a bipolar transistor, the parasitic capacitance by the data bus wiring of a sense circuit after a pre-sense amplifier can be reduced by outputting the output signal from an emitter node.

Then, by the above conventional technique, a control circuit is provided to a base, for controlling the voltage of a base of an emitter follower in an output part of a pre-sense amplifier, and the voltage thoroughly lower than the usual signal level is applied to the base of an emitter follower in the pre-sense amplifier not including the memory cell corresponding to an address of the data to be read out. Therefore, since the difference between the transistor state in the case of including the selected memory cell and that in the case of not including the one clearly appears in the level of the output voltage (emitter voltage) of the outputting emitter follower, the output signals of the selected memory cell can be easily selected or specified by the wired-OR-logic operation of the output signals of the plural pre-sense amplifiers.

Then, it is possible to compose a sense circuit having a hierarchical structure wherein plural pre-sense amplifiers are adequately divided into plural groups, and the wired-OR-logic of the output signals in each one of the groups is executed, and further the wired-OR-logic operation of the outputs of the wired-OR-logic operation of the groups via an emitter follower is executed and the wired-OR-logic operation is repeated by several stages. Therefore, by dividing the data bus lines of a sense circuit hierarchically into multi-stages, the RC delay can be reduced. To be more precise, the RC delay is decided by the RC between the former stage of an emitter follower and the present stage of an emitter follower, the wiring length between the two stages of emitter followers is effectively reduced.

However, the output voltage of an emitter of an emitter follower is reduced by the voltage decrease of Vbe (for example, about 0.8 V) between a base and a emitter, to the signal level input to a base of the emitter follower. Then, if the wired-OR-logic operation of signals divided into multi-stages is sequentially executed via multi-stages of emitter followers, the signal voltage is largely decreased. And, sometimes, the signal voltage decreases under the lower limit operational voltage of a sense amplifier provided at the final stage or the next stage of an emitter follower. For example, in case a sense amplifier is composed by using a current switch of ECL, the lower limit level of an input signal input to the current switch is 1.2 V where the voltage decrease between a base and an emitter is 0.8 V and the required minimum operational voltage of a constant current source connected to an emitter of the current switch is 0.4 V. Therefore, if the voltage of a power source of a memory apparatus is 3.3 V, it is impossible to compose more than 3 stages of the wired-OR- logic via an emitter follower including an emitter follower of the output part of each pre-sense amplifier, which restricts the realization of many stages of the data bus lines and further the high-speed data access.

On the other hand, if it is intended to decrease the power voltage for reducing the consumed power, the high-speed data access is impeded since the realization of many stages of the data bus lines is restricted.

Further, there is a method of increasing the signal voltage decreased in an emitter follower by a shift-up circuit using a current switch. However, the voltage signal increased by a current switch has a constant level independent of the level of an input signal. Therefore, the output signal of the selected pre-sense amplifier can not be distinguished from the output signals of the other non-selected pre-sense amplifiers since the increased level of the selected output signal has the same level as the non-selected output signals in spite of having a level higher than those of the other output signals before being increased. That is, since the original relative level relations among the output signals of the pre-sense amplifiers are lost, the output signals from the selected memory cell can not be specified by executing the wired-OR-logic operation of the output signals increased by the current switches, of the pre-sense amplifiers. Therefore, in the case of increasing the output signals by the current switches, the sense circuit becomes complicated since a logic circuit for specifying the output signals from the selected pre-sense amplifier among the increased output signals is necessary.

SUMMARY OF THE INVENTION

Objects of the Invention:

The present invention has been achieved in consideration of the above-described problems, and is aimed at providing a circuit for logical processing, used for a memory device. In the following, the objects of the present invention are mentioned more in detail.

A first object is to provide a logic gate circuit of a simple composition, being capable of operating by lower voltage power than conventional devices, for example, at about 2.0 V.

Another object is to provide a parallel test circuit for memory cells, being capable of normally executing the parallel test of memory cells (multi-bit test) by the lower voltage power, for example, of about 2.0 V.

Yet another object is to provide a sense circuit capable of executing the wired-OR-logic operation of outputs of a group of pre-sense amplifiers and further a group of the groups by hierarchically dividing outputs of plural pre-sense amplifiers into multi-stages of groups, and securing operational voltage of such a circuit element of the final stage of the sense circuit as a sense amplifier and so forth.

Still another object is to provide a sense circuit capable of executing the wired-OR-logic operation of the outputs of plural pre-sense amplifiers, each output part of them having an emitter follower, and securing operational voltage of the final stage sense amplifier of the sense circuit, and reducing the power voltage of the sense circuit.

Another object is to provide a semiconductor memory device realizing a high-speed data access time even at the lower power voltage.

Methods Solving the Problems:

The first feature of the present invention is that a logic processing circuit by the present invention has the first means, including a plurality of bus lines to which a plurality of logic signals are input, a level shift circuit including a diode device having a plurality of inputs and one output, and a level comparing circuit of a differential circuit including two inputs, to one of which the reference voltage is fed, the plurality of inputs of the diode device of the level shift circuit being connected to at least two of the plurality of bus lines, and the other input of the differential circuit of the level comparing circuit being connected to the output of the diode device, for executing AND logic of at least two logic signals of the plurality of logic signals input to the plurality of bus lines.

The second feature of the present invention is that a logic processing circuit by the present invention has the second means, using a parallel test circuit of memory cells including a memory cell array, a plurality of column switches for selecting a specific memory cell of the memory cell array and outputting information memorized in the selected memory cell to common bit lines, a plurality of pre-sense amplifiers outputting the information output to the common bit line to a pair of common data bus lines, a main sense amplifier connected to the pair of common data bus lines and a test circuit connected to the pair of common data bus line, the test circuit having a level shift circuit including a diode device having two inputs and one output and a pull-up current source connected to the output, and a level comparing circuit of a differential circuit including two inputs, to one of which the reference voltage is fed, the two inputs of the diode device of the level shift circuit being respectively connected to two of the pair of bus lines, and the other input of the differential circuit of the level comparing circuit being connected to the output of the diode device, for executing AND logic of the two logic signals input to the pair common data bus lines from the outputs of the differential circuit.

By the first means, the levels of the logic signals output to the more than two bus lines are raised by the pull-up current source of the level shift circuit and the logic signals of the raised level are compared with the reference voltage by the level comparing circuit, and further AND logic output of the logic signals is obtained from the output of the level comparing circuit.

Then, since the level comparing circuit does not need the composition having a transistor connected to a power source in series and the level shift circuit raises the levels of the logic signals, the level comparison function of the level comparing circuit is not harmed even if the voltage of the power source decrease, for example, near to 2.0 V, so the required outputs are always obtained from the level comparing circuit.

As mentioned above, by the first means, the correctly operating logic gate circuit is obtained even if the voltage of the power source decreases, for example, near to 2.0 V, and the composition of the logic gate circuit can be simplified.

Then, By the second means, the levels of the logic signals output to the pair of the common data bus lines are raised by the pull-up current source of the level shift circuit and the logic signals of the raised level are compared with the reference voltage by the level comparing circuit, and further AND (NAND) logic output of the logic signals is obtained from the output of the level comparing circuit.

Then, since the level comparing circuit does not need the composition having a transistor connected to a power source in series and the level shift circuit raises the levels of the logic signals, the level comparison function of the level comparing circuit is not harmed even if the voltage of the power source decrease, for example, near to 2.0 V, so the required results of the multi-bit test are always obtained from the level comparing circuit.

As mentioned above, by the second means, the correctly operating parallel test circuit of memory cells is obtained even if the voltage of the power source decreases, for example, near to 2.0 V, and the composition of the parallel test circuit of memory cells can be simplified.

The another feature of the present invention is that a sense circuit of a semiconductor memory device by the present invention comprises a plurality of pre-sense amplifiers for amplifying and outputting signals read out from a plurality of memory cells belonging to each one of memory cell groups into which the memory cells are divided, a plurality of common lines, each of the plurality of common lines commonly connecting, via an emitter follower, outputs of the pre-sense amplifiers of each one of a plurality of pre-sense amplifier groups into which the plurality of pre-sense amplifiers are divided, the plurality of common lines being divided into multi-stages for executing the wired-OR-logic operation of outputs of the plurality of common lines, two neighboring stages of the multi-stage being connected each other via an emitter follower to execute the wired-OR-logic operation of outputs of the common lines in each stage, and a sense amplifier for amplifying and outputting outputs from final stage of the multi stage, wherein a shift-up circuit is inserted in at least one place between two neighboring stages of the multi-stage, a N side of a PN junction of the shift-up circuit being connected to a former stage of common lines, and a P side being connected to a latter stage of common lines and to a high voltage power source via a pull-up current source.

The further another feature of the present invention is that a sense circuit of a semiconductor memory device by the present invention comprises a plurality of pre-sense amplifiers for amplifying and outputting signals read out from a plurality of memory cells belonging to each one of memory cell groups into which the memory cells are divided, a plurality of common lines, each of the plurality of common lines commonly connecting, via an emitter follower, outputs of the pre-sense amplifiers of each one of a plurality of pre-sense amplifier groups into which the plurality of pre-sense amplifiers are divided, and executing the wired-OR-logic operation of said outputs, and a sense amplifier for amplifying and outputting outputs obtained by executing the wired-OR-logic operation of outputs from the plurality of common lines, wherein a pull-up circuit is connected to each of the plurality common lines of the pre-sense amplifier groups, the pull-up circuit connects the common lines to a high voltage power source when a selection signal, indicating whether a memory cell connected to the pre-sense amplifier group including the pull-up circuit is selected or not, by designating an address of the memory cell, is of a state of non-selection, and a shift-up circuit, for increasing input signal voltage, including a multi-emitter transistor having plural emitters, is inserted in an input side of said sense amplifier, the plurality of common lines being connected to each of the multi-emitters of the multi-emitter transistor, a base and a collector of the transistor being commonly connected and connected to the high voltage power source, and the base being input to the input of the sense amplifier.

By the above another feature of the present invention, the signal levels of the common lines can be raised by the voltage of the voltage decrease Vb in the forward voltage decrease of the PN junction by the PN junction of the shift-up circuit. Then, since the signal levels of the plurality of common lines can be raised as keeping the high-low relations among the signals even by raising the all levels with the shift-up circuit, only the signal of the selected pre-sense amplifier can be output via the sense amplifier by executing the wired-OR-logic operation of the outputs from the plurality of common line.

And the raised level can be adjusted to the voltage of integral number times of Vb by adjusting the serial stage number of PN junctions. Then, even if the signal level decreases corresponding to the stage number of emitter followers by executing the wired-OR-logic operation of outputs of each stage in the multi-stage grouped common lines, via an emitter follower in each stage, the lower limit level of the operational voltage of ECL current switch or the final stage of an emitter follower is secured by the shift-up circuit. Therefore, it is possible to realize a sense circuit operable even if the voltage of the power source decreases, for example, less than 2.0 V.

As the pre-sense amplifier, the one of amplifying an input signal by a current switch and outputting it via an emitter follower is preferable since the parasitic capacitance of data bus lines can be reduced much more. In the case of amplifying an input by using a current switch, since the relative level relations among the input signals are lost, a base voltage control circuit should be provided to switch the level of a signal input to a base of the emitter follower, to a level sufficiently lower than the usual signal voltage, in the non-selected state of the selection signal of the pre-sense amplifier.

Then, it is desirable to set the current value of the first current source of the shift-up circuit less than a half of the current value of the second current source connected between the common lines of the former stage and the lower voltage power source. By setting the current value of the first current source so, the effects on the potential of the common lines by the current flowing to the common lines from the first current source via the PN junction are suppressed in small.

The PN junction is realized by a diode or a transistor having a diode connection.

The sift-up circuit is preferably provided at a place near to the common lines of the final stage.

Further, by the further another feature of the present invention, the signals of the common lines of the selected memory cell are input to the multi-emitter transistor in the original levels since the pull-up circuit, to which a selection signal of the selected state is input, does not go in to the active state. On the other hand, the signals of the common lines of the non-selected memory cell are raised to the level of the high voltage power source and input to the multi-emitter transistor since the pull-up circuit, to which a selection signal of the non-selected state is input, goes in to the active state. Therefore, since the current flows into the common line having the lowest signal level of the common lines input to the emitters, from the collector of the multi-emitter transistor, and the output of the sift-up circuit, being the voltage of the connection part of the collector and the base, is raised to the signal level of the common line having the lowest value, which is raised by the forward voltage decrease Vb at the PN junction, so the voltage of the power source can be reduced by the raised voltage Vb.

BRIEF DESCRIPTION OF THE DRAWINGS

FIG. 4(a) is a figure for explaining the relations among the signals on data bus lines connected to a pre-sense amplifier (PSA), the signals sent to a common data bus lines, the third logic signal and the reference voltage Vref1, in case the signals on the data bus lines are complementary to each other.

FIG. 4(b) is a figure for explaining the relations among the signals on data bus lines connected to a pre-sense amplifier (PSA), the signals sent to a common data bus lines, the third logic signal and the reference voltage Vref1, in case the signals on the data bus lines are not complementary to each other.

FIG. 5 is a truth value table showing the relation between the logical states of the signals on the common data bus lines in the embodiment of the parallel test circuit of memory cells and the logical states of the output logic signals at the first and second output terminals.

FIG. 15 is a figure for explaining the voltage levels of each part of the embodiment shown by FIG. 14.

DETAILED DESCRIPTION OF THE EMBODIMENTS

At first, a conventional technique of a multi-bit test is explained in the following.

Figure 8:
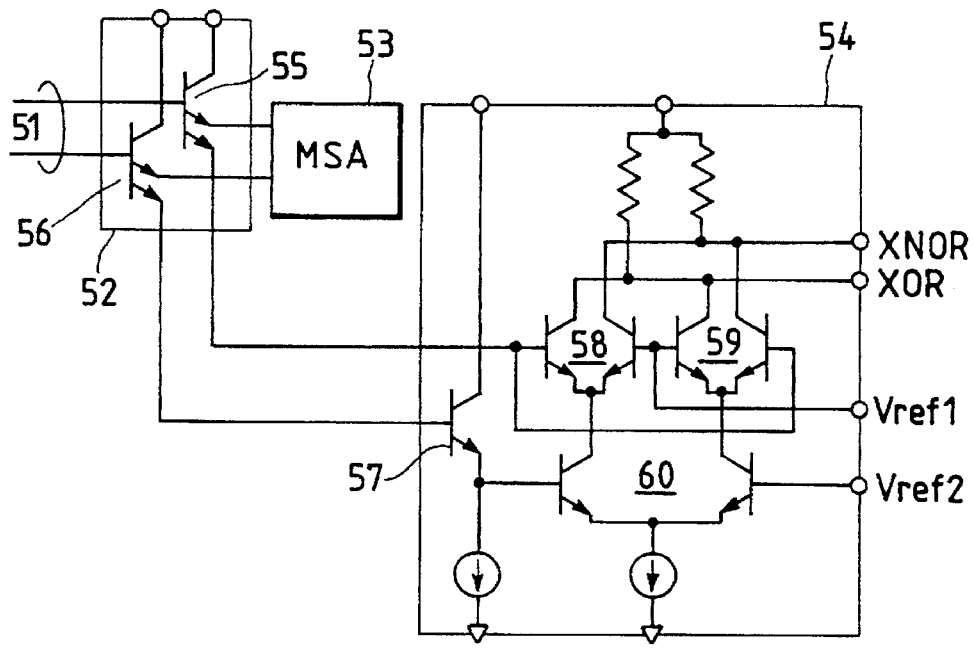
FIG. 8 is a diagram showing a circuit composition of an example of a parallel test circuit of memory cells by a conventional technique.

A multi-bit test circuit shown by FIG. 8 is composed of a pair of common data bus lines 51, a signal distributing circuit 52, a master sense amplifier (MSA) 53, a test circuit 54, the first multi-emitter transistor 55, the second multi-emitter transistor 56, an emitter follower circuit 57, the first emitter-coupled logic (ECL) circuit 58, the second ECL circuit 59 and the third ECL circuit 60. Then, the signal distributing circuit 52 is composed of the multi-emitter transistors 55 and 56 connected each other by emitter follower connection, and the test circuit 54 is a XOR logic circuit composed of the first to third ECL circuits 58, 59 and 60. And, to the pair of common data bus 51, plural PSAs not shown in the figure are connected, each of which can be selected from outside.

Then, each base of the first and second multi-emitter transistors 55 and 56 is connected each line of the pair of common data bus lines 51, and one emitter of one of the two transistors is connected to MSA and another emitter of the other one of the transistor to an input of the test circuit 54, respectively. The emitters of the first ECL circuit 58 and the second ECL circuit 59, being connected each other by differential connection, are connected to the collectors of the third ECL circuit, respectively. And the reference voltages Vref1 and Vref2 are fed to the bases of the first and second ECL circuit 58 and 58 and to base of the third ECL circuit 60, respectively.

The operations of the above-mentioned conventional parallel test circuit of memory cells are as follows.

If plural PSAs not shown in a figure are simultaneously selected, a pair of complementary signals connected to each of the selected PSAs is read out and output to the pair of common data bus 51. And if all memory cells are correctly read out and the plural PSAs output the complementary signals, each of which has the same polarity, the signals on the pair of common data bus lines are the complementary signals having almost the same amplitudes as the output signals of the selected PSAs. However, if more than one memory cell are not correctly read out and more than one of the plural PSAs output signals having signal levels different from the signal level of the other PSAs to the pair of common data bus lines 51, both the signals on the pair of common data bus lines are the non-complementary signals having the high level H.

Then, the signals on the pair of common data bus lines 51 are input to the signal distributing circuit 52 composed of the first and second multi-emitter transistors 55 and 56, and distributed to the emitters of the multi-emitter transistor 55 and 56, respectively. And the signal from one emitter of each one of the multi-emitter transistors is fed to MSA, and the signal from the other emitter of each one of the multi-emitter transistors is fed to the test circuit 54. Then, since the test circuit 54 acts as a XOR logic gate of the input signals, the logical state of the output of the test circuit 54 changes corresponding to whether the signals on the pair of common data bus lines (the input signals to the test circuit 54) have the different levels (the complementary signals) or the same level (the high level). Then, by the test circuit, the plural memory cells selected simultaneously are judged as all normal if the signals on the pair of common data bus lines (the input signals to the test circuit 54) have the different levels (the complementary signals), and some one of the plural memory cells selected simultaneously is judged as inferior if the signals on the pair of common data bus lines (the input signals to the test circuit 54) have the same level (the high level).

As mentioned above, the conventional parallel test circuit has such a structure that the third ECL circuit 60 is put on the first and second ECL circuits 58 and 59, as the test circuit 54 is viewed from the side of a power line. Then, if a voltage of the power source decreases, for example, near to 2.5 V, operational margins of the two bipolar transistors lost, which causes such a problem that a correct XOR logic processing of the input signals can not be executed and the parallel test (multi-bit test) becomes impossible.

In the following, the above-mentioned problem is explained more in detail. Signals sent in a pair of common data bus lines 51 are distributed and sent to the test circuit 54 and MSA 53 via a signal distributing circuit 52. Voltages of the distributed signals A and B to the test circuit 54 are reduced by 2× Vbe (where Vbe is a voltage decrease between a base and an emitter of a transistor) from a voltage of a higher side power source (Vcc). Then, since a voltage margin of 2× Vbe is needed for the two stage of the bipolar transistors and the voltage margin of Vs for the third ECL circuit 60, in the test circuit 54, the operational voltage of (4×Vbe+Vs) is totally required. If Vbe is 0.8 V and Vs is 0.4 V, then the needed operational voltage is 3.6 V (=0.8×4+ 0.4).

As mentioned above, if the voltage of a power source decreases near to 2.5 V in the parallel test circuit of memory cells, a correct XOR processing of input signals can not be executed, consequently the parallel test of memory cells (multi-bit test) becomes impossible.

The above mention is true, but it is possible to provide only one stage of the emitter follower by reducing the number of the emitter followers to the input nodes of the test circuit 54, in the above-mentioned parallel test circuit of memory cells. However, even by using the only one stage of the emitter follower, since the required operational voltage of the test circuit 54 is 2.8 V, an correct XOR processing of input signals can not be also executed, consequently the parallel test of memory cells (multi-bit test) becomes impossible if the voltage of a power source decreases near to 2.5V.

Hereinafter, details of the present invention is explained based on embodiments referring to drawings.

Figures 1, 2:
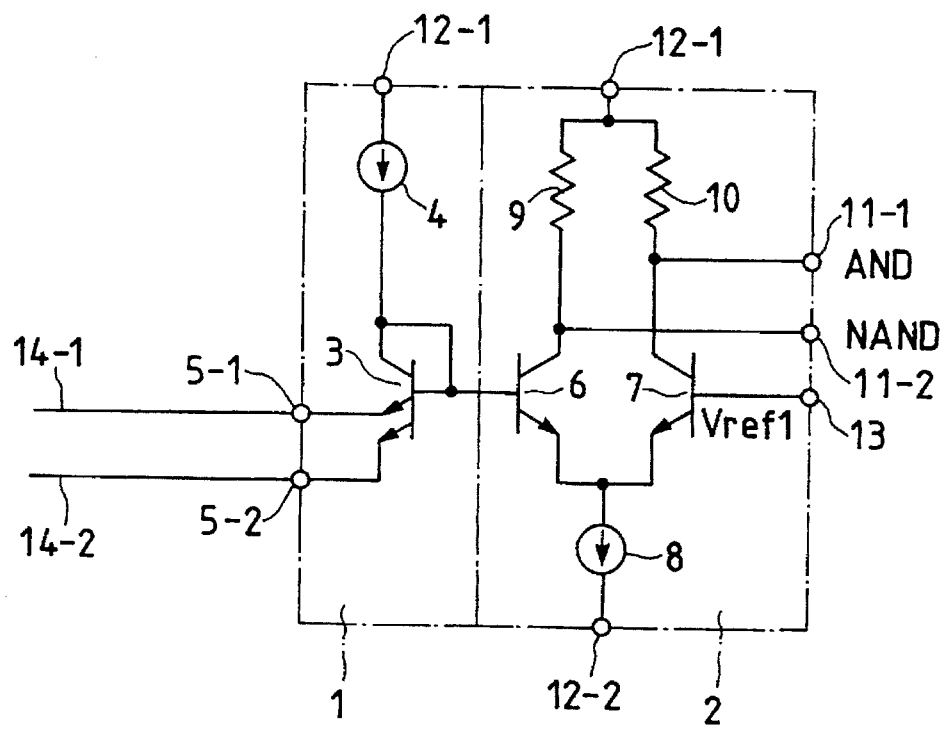
FIG. 1 is a diagram showing a circuit composition of an embodiment of a logic gate circuit by the present invention.
FIG. 2 is a truth value table showing the relation between the logical states of the first and second logic signals and the logical states of the output logic signals at the first and second output terminals, in the embodiment shown by FIG. 1.

FIG. 1 is a diagram showing a circuit composition of an embodiment of a logic gate circuit of the present invention.

The logic gate circuit shown by FIG. 1 comprises a level shift circuit 1, a level comparing circuit 2, a multi-emitter transistor 3, a pull-up current source 4, the first input terminal 5-1, the second input terminal 5-2, the first transistor 6, the second transistor 7, a current source 8, the first collector resistance 9, the second collector resistance 10, the first output terminal 11-1, the second output terminal 11-2, a high level power terminal 12-1, a low level power terminal 12-2, a reference voltage feeding terminal 13 and a pair bus lines 14-1 and 13-2.

The level shift circuit 1 includes the multi-emitter transistor 3 of which a base and a collector are commonly connected by diode connection and the pull-up current source 4 connected between the collector (the base) and the high level power terminal 12-1. And the two emitters of the multi-emitter transistor 3 are connected to the first and second input terminals 5-1 and 5-2, respectively, and the collector (the base) is connected to a base of the first transistor 6. The first and second input terminals 5-1 and 5-2 are connected to the pair of common bus lines 14-1 and 14-2, respectively. The level comparing circuit 2 includes the first and second transistors 6 and 7 of which the two emitters are commonly connected, the current source 8 connected between the commonly connected emitters and the first and second collector resistances 9 and 10 connected between the collectors of the first and second transistors 6 and 7 and the high level power terminal 12-1. Then, the base of the second transistor 7 is connected to the reference voltage feeding terminal 13, the collectors of the first and second transistors 6 and 7 to the output terminals 11-1 and 11-2, respectively, and the reference voltage Vref1 is fed to the reference voltage feeding terminal 13.

The logic gate circuit having the above-mentioned composition operates as follows.

The first and second logic signals sent to the pair of bus lines 14-1 and 14-2 are input to the level shift circuit 1 via the first and second input terminals 5-1 and 5-2, and fed to the two emitters of the multi-emitter transistor 3. Then, if the states of the first and second logic signals both are the logical high H, both the emitters of the multi-emitter transistor 3 become the ON state, and the voltage higher by Vbe (voltage decrease between the base and the emitter) than the level of the logical high H appearing at the collector (base) is fed to the following level comparing circuit 2 as the third logic signal. And if one of the states of the first and second logic signals is the logical high H and the other is the logical low L, the state between the collector and the emitter input by the logic signal of the logical low L becomes conducting, namely, the ON state, and the voltage higher by Vbe (voltage decrease between the base and the emitter) than the level of the logical low L appearing at the collector (base) is fed to the following level comparing circuit 2 as the third logic signal. Further, if the states of the first and second logic signals both are the logical low L, the multi-emitter transistor 3 become also the ON state, and the voltage higher by Vbe than the level of the logical low L appearing at the collector (base) is fed to the following level comparing circuit 2 as the third logic signal of the logical low L.

Further, the third logic signal fed to the level comparing circuit 2 is input to the base of the first transistor 6 and compared with the reference voltage Vref1 fed to the base of the second transistor 7. Then, if the state of the third logic signal is the logical high H, the first transistor 6 becomes the ON state and the second transistor 7 the OFF state since the level of the logical high H is higher than the reference voltage Vref1, and the output logic signal of the logical high H is sent to the first output terminal 11-1 and the logic signal of the logical low L to the second terminal 11-2. And if the state of the third logic signal is the logical low L, the first transistor 6 becomes the OFF state and the second transistor 7 the ON state since the level of the logical low L is lower than the reference voltage Vref1, and the output logic signal of the logical low L is sent to the first output terminal 11-1 and the logic signal of the logical high H to the second terminal 11-2, respectively.

FIG. 2 is a truth value table showing the relation between the logical states of the first and second logic signals, and the logical states of the output logic signals at the first and second output terminals, in the embodiment shown by FIG. 1.

As shown in FIG. 2, only when the states of the first and second logic signals both are the logical high H, the logical state of the output logical signal sent to the first output terminal 11-1 is the logical high H and the logical state of the output logical signal sent to the second output terminal 11-2 is the logical low L. Then, if either or both of the states of the first and second logic signals are the logical high H, the logical state of the output logical signal sent to the first output terminal 11-1 is the logical low L and the logical state of the output logical signal sent to the second output terminal 11-2 is the logical high H. Therefore, by the logic gate circuit, the AND logic output or the NAND logic output of the first and second logic signals can be obtained.

As mentioned above, by the embodiment of a logic gate circuit of the present invention, since more than two stages of transistors need not to be serially connected between the high level power terminal 12-1 and the low level power terminal 12-2, in the level comparing circuit, and the level shift circuit 1 executes the effective level-up of the first and the second logic signals, the level comparison function of the level comparing circuit 2 is not lost even if the power voltage decreases, for example, near to 2.0 V, and then, the logic gate circuit is always and correctly operated and the required AND or NAND logic output can be gained.

Figure 3:
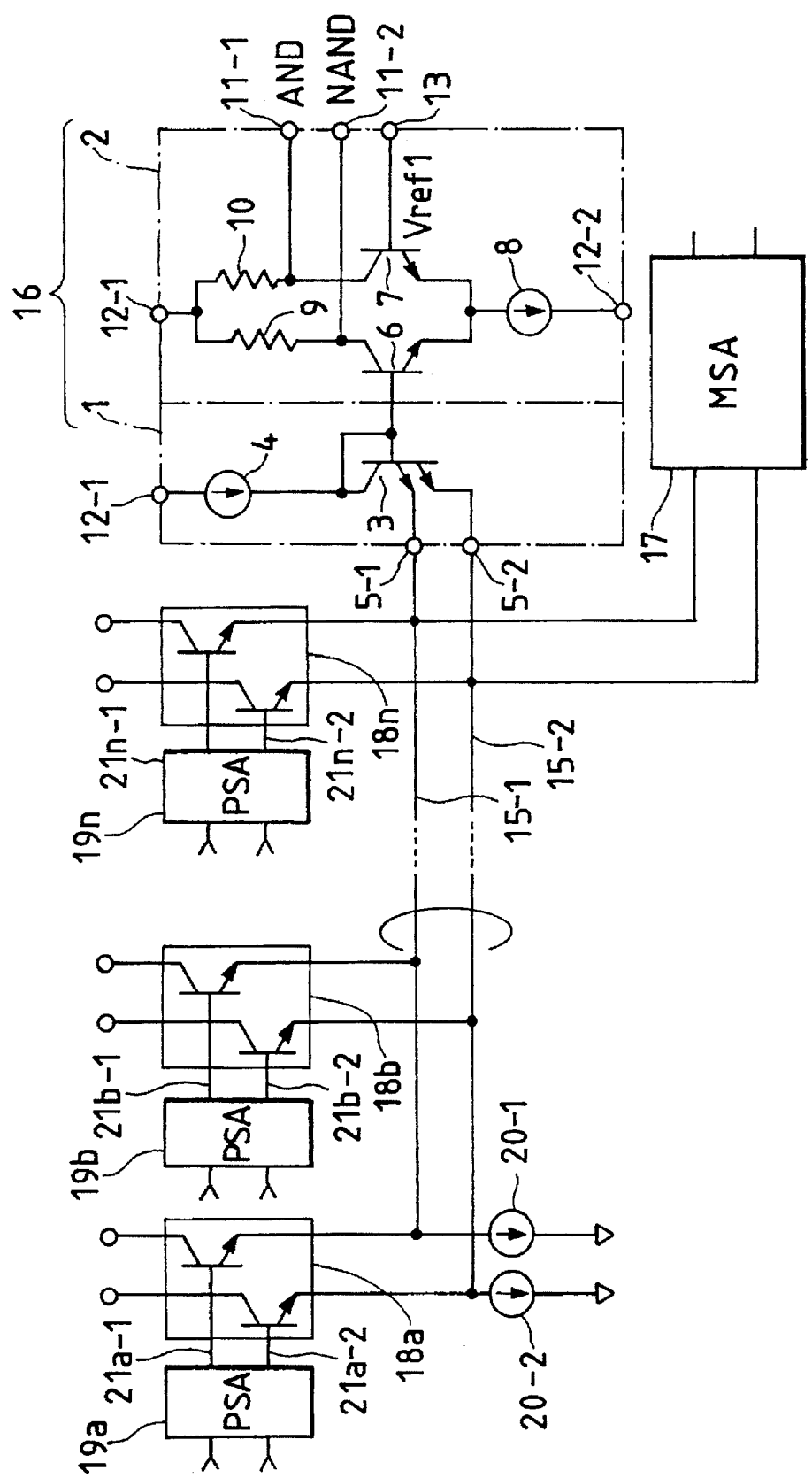
FIG. 3 is a diagram showing a circuit composition of an embodiment of a parallel test circuit of memory cells by the present invention.

FIG. 3 is a diagram showing a circuit composition of the first embodiment of a parallel test circuit of memory cells by the present invention.

The parallel test circuit of memory cells shown by FIG. 3 comprises a pair of common data bus lines 15-1 and 15-2, a test circuit 16, a main sese amplifier (MSA) 17, emitter follower circuits 18a, 18b, ..., 18n, pre-sense amplifiers (PSA) 19a, 19b, ..., 19n, pull-down power sources 20-1 and 20-2, base nodes of each emitter follower of pre-sense amplifiers 21a-1 and, 21a-2, 21b-1 and 21b-2, ..., 21n-1 and 21n-2, and the same numerals are marked to the same components as the ones shown in FIG. 1.

And the test circuit 16 is the same one as the logic gate circuit shown in FIG. 1 and has the level shift circuit 1 and the level comparing circuit 2. The pair of common data bus lines 15-1 and 15-2 are connected to the input terminal 5-1 and 5-2 of the test circuit 16 and the input terminal of MSA. Each of the emitter follower circuits 18a, 18b, ..., 18n is composed two emitter follower connection transistors. In the two transistors of the emitter follower circuit 18a, the base nodes 21a-1 and 21a-2 are connected to the output terminals of PSA 19a, the emitters to the pair of common data bus lines 15-1 and 15-2, and the collectors to the high level power terminal 12-1. The two transistors of the other emitter follower circuits 18b, ..., 18n have the same connection structure as that of the emitter follower circuit 18a. And the pull-down power sources 20-1 and 20-2 are connected between the pair of common data bus lines 15-1 and 15-2, and the low level power terminal 12-2, respectively. Then, memory cell groups not shown in FIG. 3, of which the memory cells are selected by a column switch in turn, are connected to the input terminals of PSAs 19a, 19b, ..., 19n.

The parallel test circuit of memory cells having the above-mentioned composition operates as follows.

When PSA 19a is selected, the logic signals read out from the memory cell group connected to PSA 19a are fed to the base nodes 21a-1 and 21a-2 from the output terminals of PSA 19a and fed to the pair of common data bus lines 15-1 and 15-2 via the two transistors of the emitter follower 18a. And if the signals are correctly read out from the memory cell, that is, the memory cell is correct, the logic signals fed to the base nodes 21a-1 and 21a-2 and the pair of common data bus lines 15-1 and 15-2 are the complementary signals. The levels of the complementary signals are lower by Vbe (voltage decrease between the base and the emitter) than the levels of the complementary signals fed to the base nodes 21a-1 and 21a-2. The operations of PSA 19b, ..., 19n are the same as those of PSA 19a, and if the signals are correctly read out from the corresponding memory cell, the complementary signals are also fed to the pair of common data bus lines 15-1 and 15-2. On the contrary, if the signals are not correctly read out from the corresponding memory cells, that is, one or more than one memory are inferior, the logic signals of the logical high H are led out to both of the pair of common data bus lines 15-1 and 15-2. The reason of the operations is because the levels of the logic signals having the logical low L level of the complementary signals are raised to the logical high H level by the logical high H level of the logic signals from the inferior memory cells and consequently both of the signals on the pair of common bus lines turn to the logical high H state, although the complementary signals are read out from the plural normal memory cells.

Then, the logic signals sent to the pair of common data bus lines 15-1 and 15-2 are input to the test circuit 16 via the first and second input terminals 5-1 and 5-2. And if the logic signals led out to the pair of common data bus lines 15-1 and 15-2 are the complementary signals, since the logic signal of the logical low L is fed either of the two emitters, the state of the emitter to which the logical low L is input becomes conducting, namely, the ON state, and the voltage higher by Vbe (voltage decrease between the base and the emitter) than the level of the logical low L appearing at the collector (base) is fed to the following level comparing circuit 2 as the third logic signal. On the other hand, if the logic signals led out to the pair of common data bus lines 15-1 and 15-2 both are the logical high H, both the emitters of the multi-emitter transistor 3 become the ON state, and the voltage higher by Vbe than the level of the logical high H appearing at the collector (base) is fed to the following level comparing circuit 2 as the third logic signal.

Further, the third logic signal fed to the level comparing circuit 2 is input to the base of the first transistor 6 and compared with the reference voltage Vref1 fed to the base of the second transistor 7. Then, if the state of the third logic signal is the logical low L, the first transistor 6 becomes the OFF state and the second transistor 7 the ON state since the level of the logical low L is lower than the reference voltage Vref1, and the output logic signal of the logical low L is sent to the first output terminal 11-1 and the logic signal of the logical high H to the second terminal 11-2, respectively. And if the state of the third logic signal is the logical high H, the first transistor 6 becomes the ON state and the second transistor 7 the OFF state since the level of the logical high H is higher than the reference voltage Vref1, and the output logic signal of the logical high H is sent to the first output terminal 11-1 and the logic signal of the logical low L to the second terminal 11-2, respectively.

Then, in the above-mentioned embodiment, it is necessary to set the difference between the output signal level of the non-selected PSA, for example, PSA 19b, and the one of the selected PSA, for example, PSA 19a to a value more than the predetermined value (at least the logic signal amplitude), for example, 1.0 V, since the multi-emitter transistor 3 executes the wired-OR-logic operation of the signals induced on the pair of common data bus lines 15-1 and 15-2.

Further, in the above- mentioned operations of the embodiment, after the signals led out to the pair of common data bus lines 15-1 and 15-2 are fed to the emitters of the multi-emitter transistor 3 of diode connection, respectively, the signals are pulled up by feeding the voltage of the high level power terminal 12-1 to them at the collector (base) of the multi-emitter transistor 3 via the pull-up current source 4. Then, the third logic signal is obtained by raising the level of the signal having a lower level of the two logic signals led out to the pair of common data bud lines 15-1 and 15-2, by Vbe.

FIGS. 4(a) and 4(b) are figures for explaining the relations among the signals sent to the base nodes 21a-1 and 21a-2 connected the output terminals of a pre-sense amplifier (PSA), for example, PSA 19a, the signals induced on the pair of common data bus lines 15-1 and 15-2, the third logic signal and the reference voltage Vref1.

As shown in FIG. 4(a), the signals sent to the base nodes 21a-1 and 21a-2 are the complementary signals, that is, all the memory cells are normal. And, in FIG. 4(b), the signals sent to the base nodes 21a-1 and 21a-2 both are of the logical high state H, that is, some of the memory cells are inferior.

As shown in FIG. 4(a), if all the memory cells are normal, the complementary signals are sent to the base nodes 21a-1 and 21a-2. Then, the levels of the complementary signals are reduced by $Vbe_1$ (voltage decrease between a base and an emitter of a transistor composing the emitter follower circuit 18a) at the emitter follower circuit 18a, and the complementary signals are sent to the pair of common data bus lines 15-1 and 15-2 and to the emitters of the multi-emitter transistor 3. Then, the multi-emitter transistor 3 raises the level of only the logic signal having a lower level L of the two logical signals input to the emitters, by $Vbe_2$ (voltage decrease between a base and an emitter which are of the ON state, of the multi-emitter transistor 3), and the third logic signal having a level lower than the reference voltage $Vref_1$ is induced at the collector (base). On the contrary, the logic signal having a higher level H of the complementary signals input to the multi-emitter transistor 3 cannot drive the multi-emitter transistor 3 to the ON state and does not give any effect on the third logic signal, since the difference between the level of the logic signal having a higher level and the level of the third logic signal induced at the collector (base) does not reach $Vbe_2$.

On the other hand, as shown in FIG. 4(b), if at least one of the memory cell group connected to PSA 19a is inferior, at least one of the base nodes 21a-1 and 21a-2 becomes the logical high state. On the base nodes 21b-1 and 21b-2, . . . , 21n-1 and 21n-2, the same occurs. Then, the level of each one of the signals of the logical high H state is reduced by $Vbe_1$ and sent to the pair of common data bus lines 15-1 and 15-2 as the signal of the logical high H state, and is fed to one of the emitters of the multi-emitter transistor 3. The multi-emitter transistor 3 raises the level of only the logic signal having a lower level of the logical high H signals input to the emitters, by $Vbe_2$, and the third logic signal of the logical high H signal having a level higher than the reference voltage $Vref_1$ is induced at the collector (base). On the contrary, the logic signal having a higher level H of the signals input to the multi-emitter transistor 3 cannot drive the multi-emitter transistor 3 to the ON state and does not give any effect on the third logic signal, since the difference between the level of the logic signal having a higher level and the level of the third logic signal induced at the collector (base) does not reach $Vbe_2$ slightly.

And, in the embodiment, in order to operate the multi-emitter transistor 3 effectively, it is needed to set the current value of the pull-up current source 4 as a value sufficiently lower than the values of the pull-down current sources 20-1 and 20-2.

In above explaining the operations of the embodiment, for simplicity, it is explained that one of PSAs 19a, 19b, . . . , 19n is selected in turn. However, in the practical parallel test of memory cells (multi-bit test), plural PSAs, for example, PSAs 19a and 19b, are simultaneously selected, and the logical signals from the selected PSAs are commonly fed to the pair of common data bus lines 15-1 and 15-2. Also in the practical parallel test of memory cells (multi-bit test), if all the memory cells connected to PSAs 19a and 19b are normal, the complementary signals are sent to the pair of common data bus lines 15-1 and 15-2. On the contrary, if some ones of the memory cells connected to PSAs 19a and 19b are inferior, the logical high H signals are sent to both the pair of common data bus lines 15-1 and 15-2.

FIG. 5 is a truth value table showing the relation between the logical states of the signals on the pair of common data bus lines 15-1 and 15-2 in the embodiment of the parallel test circuit of memory cells and the logical states of the output logic signals at the first and second output terminals 11-1 and 11-2.

As shown by FIG. 5, if all the memory selected from PSAs are normal and the complementary signals are sent to the pair common data bus lines 15-1 and 15-2, that is, the state of one of the pair of common data bus lines 15-1 and 15-2 is the logical high H and the other is the logical low L, the logical state of the output logic signal at the first output terminal 11-1 of the test circuit 16 is the logical low L and the one at the second output terminal 11-2 is the logical high H. On the contrary, if some ones of the memory selected from PSAs are inferior, that is, the states the pair of common data bus lines 15-1 and 15-2 both are the logical high H, the logical state of the output logic signal at the first output terminal 11-1 of the test circuit 16 is the logical high H and the one at the second output terminal 11-2 is the logical low L. And, the case that the logical states of the pair of common data bus lines 15-1 and 15-2 both are the logical low, does not exist independently of whether the memory cells have inferior one or not.

As mentioned above, in the parallel, test of the array arrange memory cells by the embodiment, it is possible to judge whether the memory cells connected to the selected PSAs are normal or not by selecting one or more than one PSAs on PSAs 19a, 19b, . . . , 19n.

Then, by the embodiment, the levels of the signals led out to the pair of common data bus lines 15-1 and 15-2 are raised and compared with the reference voltage. And since the test circuit 16 has not the structure wherein plural bipolar transistors are vertically and serially connected, the composition of the test circuit 16 is simple and the test circuit 16 can correctly judge the normality of the memory cells.

Figure 6:
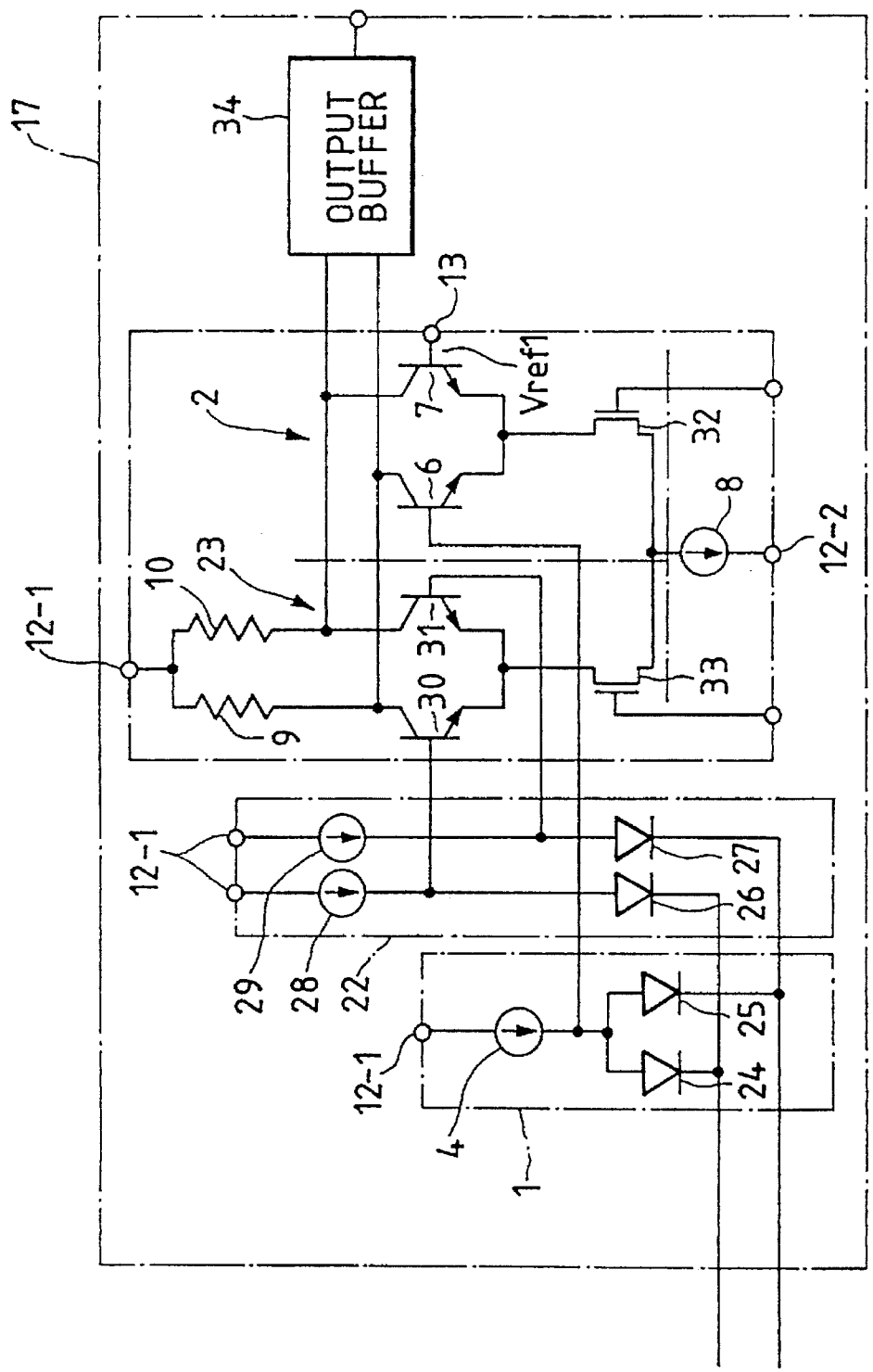
FIG. 6 is a diagram showing a circuit composition of another embodiment of a parallel test circuit of memory cells by the present invention.

FIG. 6 is a diagram showing a circuit composition of the second embodiment of a parallel test circuit of memory cells by the present invention.

The parallel test circuit of memory cells shown by FIG. 6 comprises the second level shift circuit 22, the second level comparing circuit 23, the first diode 24, the second diode 25, the third diode 26, the fourth diode 27, the second pull-up current source 28, the third pull-up current source 29, the third transistor 30, the fourth transistor 31, the first NMOS-FET 32, the second NMOSFET 33 and an output buffer circuit, and the same numerals are marked to the same components as the ones shown in FIG. 3.

Then, the first level shift circuit 1 consist of the first pull-up current source 4, the first and second diodes 24 and 25, and the cathodes of the first and the second diodes 24 and 25 are connected to the pair of common bus lines 15-1 and 15-2 and the anodes to the first pull-up correct source 4. The second level shift circuit 22 consist of the third diode 26, the fourth diode 27, the second pull-up current source 28 and the third pull-up correct source 29, and the cathodes of the third and fourth diodes 26 and 27 are connected to the pair of common data bus lines 15-1 and 15-2, and the anodes to each end of the second and third pull-up current circuits 28 and 29. the other ends of the second and third pull-up current circuits 28 and 2 are connected to the high level power terminal 12-1. In the first level comparing circuit 2, the first NMOSFET 32 is connected between the low level power terminal 12-2 and the commonly connected emitters of the first and second transistors. The second level comparing circuit 23 includes the third transistor 30, the fourth transistor 31 and the second NMOSFET 33, and the first and second collector resistances 9 and 10, and the current source 8 are hold in common by the first and second level comparing circuit 12-1 and 2. The commonly connected emitters of the third and fourth transistors 30 and 31 are connected to the current source 8 via the second NMOSFET 33, and the collectors to the first and second resistance 9 and 10. The commonly connected anodes of the first and second diodes 24 and 25 are connected to the base of the first transistor 6, and the anodes of the third and fourth diodes 26 and 27 to the bases of the third and fourth transistors 30 and 32, respectively. The collectors of the first and third transistors 6 and 30 are connected to one end of the output buffer circuit 34, and the collectors of the second and fourth transistors 7 and 31 are connected to the other end of the output buffer circuit 34. And the first and second level shift circuits 1 and 22, and the first and second level comparing circuits 2 and 23, are installed together with the output buffer circuit 34 in MSA 17.

Finding the differences between the first embodiment and the second embodiment, the differences exists in that the first and second diodes 24 and 25 are used in place of the multi-emitter transistor 3 of which the emitters are connected by diode connection, in the level shift circuit 1, and the second level shift circuit 22 and the second level comparing circuit 23 are provided, and operations of the first level comparing circuit 2 and the second one 23 are switched by a selection control signal SC fed to the gates of the first and second NMOSFETs 32 and 33. There is any difference between the compositions of the first embodiment and the second embodiment except the above-mentioned differences.

The second embodiment of a parallel test of memory cells having the above composition operates as follows.

At first, in the parallel test of memory cells (multi-bit test), the control signal SC of unidirectional polarity is fed so that the polarity of the first NMOSFET 32 is positive and the one of the second MOSFET 33 is negative. By the control signal SC, the first NMOSFET 32 turns to the ON state, which makes the first level comparing circuit 2 of the ON state, and the second NMOSFET 33 turns to the OFF state, which makes the second level comparing circuit 23 of the OFF state. In the above-mentioned situation, if the signals read out from each memory cell are led out to the pair of common data bus lines 15-1 and 15-2, the signals are the cathodes of the first and second diodes 24 and 25 of the first level shift circuit 1. The operations of the first and second diodes 24 and 25 are almost the same as those of the multi-emitter transistor 3 in the first embodiment. And the operations of the circuit after the above operation is also almost the same as explained in the first embodiment. Then, if all the selected memory cella are normal, the complementary signals of which one is the logical low L signal and the other is the logical high H, are fed to the input terminals of the output buffer circuit 34, respectively. And if all the selected memory cella are normal, the complementary signals of which one is the logical high H signal and the other is the logical low L, are fed to the input terminals of the output buffer circuit 34, respectively. Nextly, in case the parallel test of memory cells (multi-bit test) is not carried out, the control signal SC of unidirectional polarity is fed so that the polarity of the first NMOSFET 32 is negative and the one of the second MOSFET 33 is positive. By the control signal SC, the first NMOSFET 32 turns to the OFF state, which makes the first level comparing circuit 2 of the OFF state, and the second NMOSFET 33 turns to the ON state, which makes the second level comparing circuit 23 of the ON state. In the situation of the circuits, when the complementary logic signals read out from the selected memory cells are led out to the pair of common data bus lines 15-1 and 15-2, and fed to the emitters of the third and fourth diodes 26 and 27 of the second level shift circuit 22, respectively, the levels of the complementary logic signals are shifted up by Vbe (voltage decrease between an anode and a cathode of each one of the diodes 26 and 27) by the second and third pull-up current source 28 and 29. And the shifted up complementary logic signals are fed to the bases of the third and fourth transistors 30 and 31 of the second level comparing circuit 23 from the anodes of the third and fourth diodes 26 and 27. Then, the shifted up complementary logic signals are inverted and amplified by the transistors 30 and 31, and fed to the two input terminals of the output buffer circuit 34 from the collectors of the transistors.

As mentioned above, by the embodiment, the following effect besides the effect by the first embodiment can be gained, that is, the effect that the whole circuit composition can be simplified since the test circuit 16 for executing the parallel test of memory cells (multi-bit test) is incorporated into MSA 17.

Now, although the level shift circuit 1 is composed of the first and second diodes 24 and 25, the composition of the level shift circuit 1 is not restricted to such a composition, and the multi-emitter transistor having the diode connection is also applicable.

And although the multi-emitter transistor having the diode connection is used for the level shift circuit 1 in the first embodiment of a logic gate circuit and in the first embodiment of a parallel test circuit of memory cells, the composition of the level shift circuit 1 is not restricted to such a composition, and the first and second diodes 24 and 25 as well as the second embodiment of a parallel test circuit of memory cells are also applicable.

Further although the first and second transistors 6 and 7 having the differential connection is used for the level comparing circuit 2 in the first embodiment of a logic gate circuit and in the first and second embodiments of a parallel test circuit of memory cells, the composition of the level comparing circuit 2 is not restricted to such a composition, and any elements are also applicable unless the circuit is not so composed that transistors are vertically and serially piled up between the power sources 12-1 and 12-2.

Figure 7:
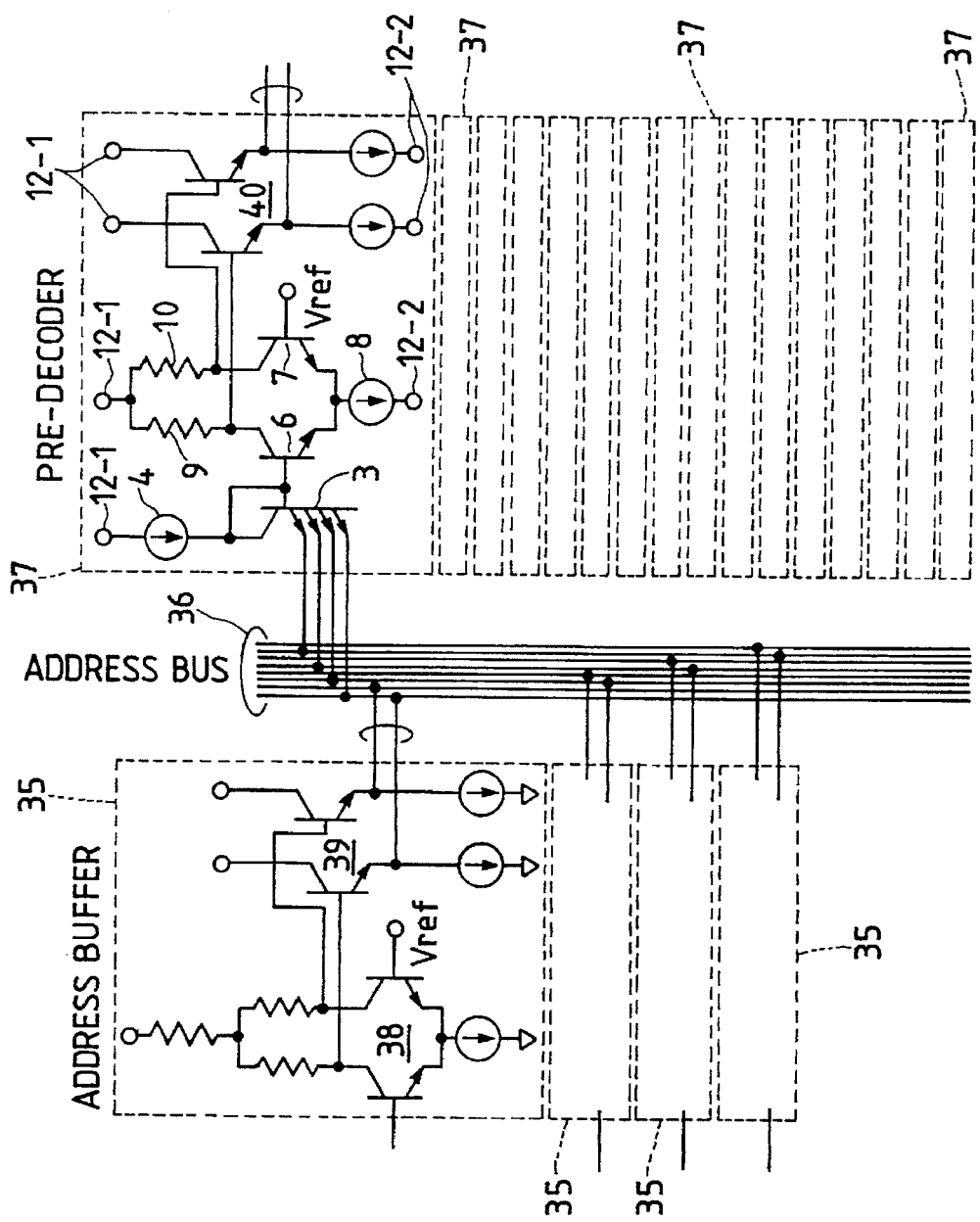
FIG. 7 is a diagram showing a circuit composition of another embodiment of a logic gate circuit by the present invention.

FIG. 7 is a diagram showing a circuit composition of the second embodiment of a logic gate circuit, and the embodiment is an example of a decoder circuit.

The decoder circuit shown by FIG. 7 comprises an address buffer circuit 35, an address bus 36, a pre-decoder circuit 37, an emitter-coupled logic ECL 38, the first emitter follower circuit 39 and the second emitter follower 40, and the same numerals are marked to the same components as the ones shown in FIG. 1.

Then, the address buffer circuit 35 is composed of the ECL circuit 38 and the first emitter follower 39, and the pre-decoder 37 is composed of the level shift circuit 1, the level comparing circuit 2 and the second emitter follower circuit 40. A plurality of the address buffer circuits 35 are provided to the address bus 36, and a pair of outputs from each of the plurality of the address buffer circuit are connected to each pair of lines of the address bus 36. The each pair of lines of the address bus 36 are the emitters of the multi-emitter transistor 3.

The decoder circuit 37 having the above-mentioned composition operates as follows. Each of the address buffer circuit 35 sends the complementary logic signals and the complementary logic signals are fed to the corresponding pair of lines of the address bus 36. The complementary logic signals led out to the address bus 36 are fed to the plural emitters (4 in FIG. 7) of the multi-emitter transistor 3 and four address signals are formed by the combination of the four complementary signals. Then, the pre-decoder 37 decode the four address signals by the obtained AND logic outputs of the address signals by the logic gate circuit (the logic gate circuit executes the same operations as the one shown in FIG. 1 and then, the operations are omitted.) and the decoded signals are taken out via the second emitter follower circuit 40.

As mentioned above, by the embodiment, the pre-decoder 37 of a simple circuit composition is also realized, and further the decoding function of the pre-decoder is not lost even if the power voltage decreases, for example, near to 2.0 V.

Further, a multi-stage decoder circuit can be realized by connecting a pre-decoder having the same composition as the pre-decoder 37 to the output of the pre-decoder 37.

Then, each composition of the level shift circuit 1 and the level comparing circuit 2 in the pre-decoder 37 is not restricted to the ones shown in the embodiment, and the commotions can be changed as a matte of course if the changes do not change each function of the circuits.

As explained above, by the logic gate circuit of the present invention, the logic signals fed to the more than one bus lines 14-1 and 14-2 are pulled up by the pull-up current source 4 of the level shift circuit 1, and the levels of the pulled up logic signals are compared with the reference voltage $Vref_1$ by the level comparing circuit 2, and the AND (NAND) logic output of the logic signals is led out to the outputs of the level comparing circuit 2. Then, since the level comparing circuit 2 has not such a structure that transistors are vertically and serially piled up between the power sources 12-1 and 12-2, and the levels of the logic signals are shifted up by the sift-up circuit 1, the level comparison function of the level comparing circuit 2 is not lost even if the power source voltage decreases, for example, near to 2.0 V, and the required logic outputs can be always obtained from the level comparing circuit 2.

Therefore, by the logic gate circuit of the present invention, even if the power source voltage decreases, for example, near to 2.0 V, the logic gate circuit correctly operates, the composition of the logic gate circuit becomes simple.

Further, by the parallel test circuit of the present invention, the logic signals fed to the common data bus lines 15-1 and 15-2 are pulled up by the pull-up current source 4 of the level shift circuit 1, and the levels of the pulled up logic signals are compared with the reference voltage $Vref_1$ by the level comparing circuit 2, and the AND (NAND) logic output of the logic signals is led out to the outputs of the level comparing circuit 2. Then, since the level comparing circuit 2 has not such a structure that transistors are vertically and serially piled up between the power sources 12-1 and 12-2, and the levels of the logic signals are shifted up by the sift-up circuit 1, the level comparison function of the level comparing circuit 2 is not lost even if the power source voltage decreases, for example, near to 2.0 V, and the required multi-bit test results can be always obtained from the level comparing circuit 2.

Therefore, by the parallel test circuit of memory cells of the present invention, even if the power source voltage decreases, for example, near to 2.0 V, the parallel test circuit of memory cells correctly operates, the composition of the parallel test circuit of memory cell becomes simple.

In the following, a sense circuit to which a memory circuit of the present invention is applied, is explained.

Figure 9:
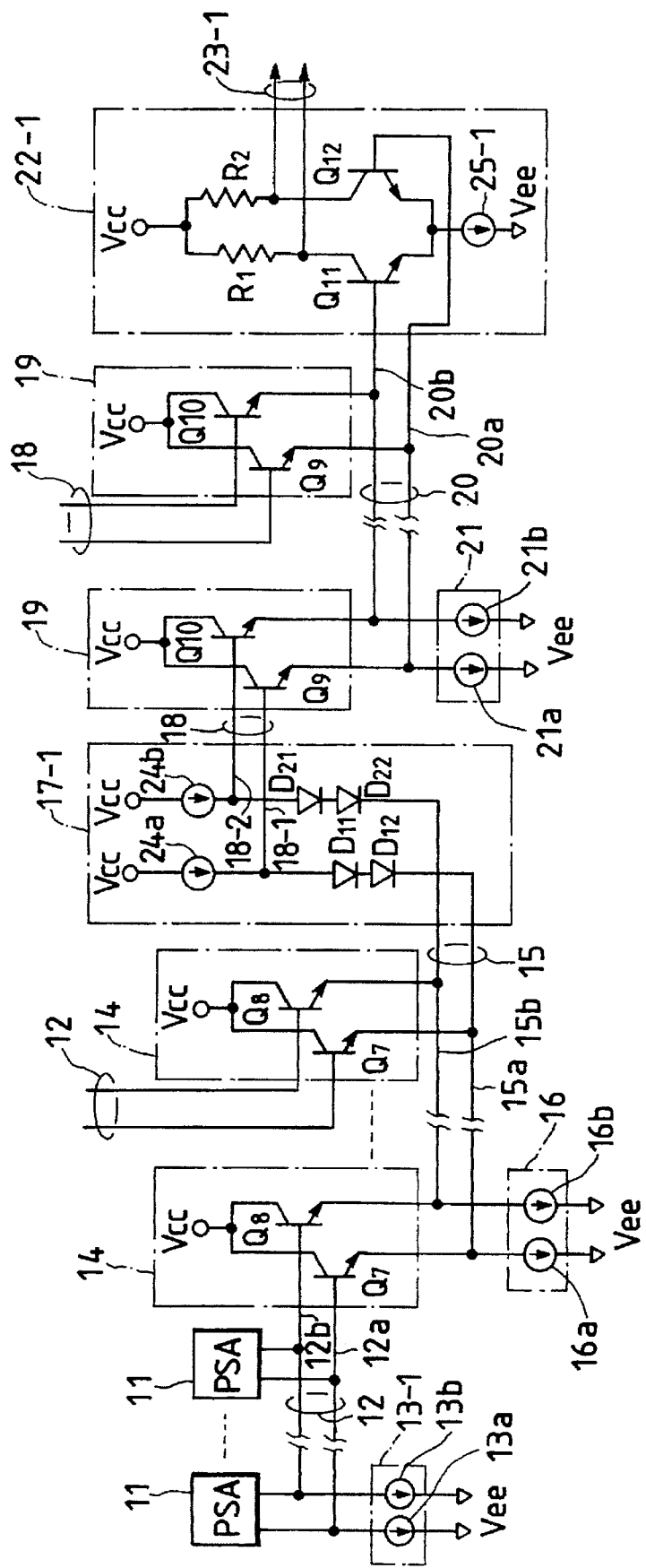
FIG. 9 is a diagram showing a circuit composition of an embodiment of a sense circuit by the present invention.
Figure 10:
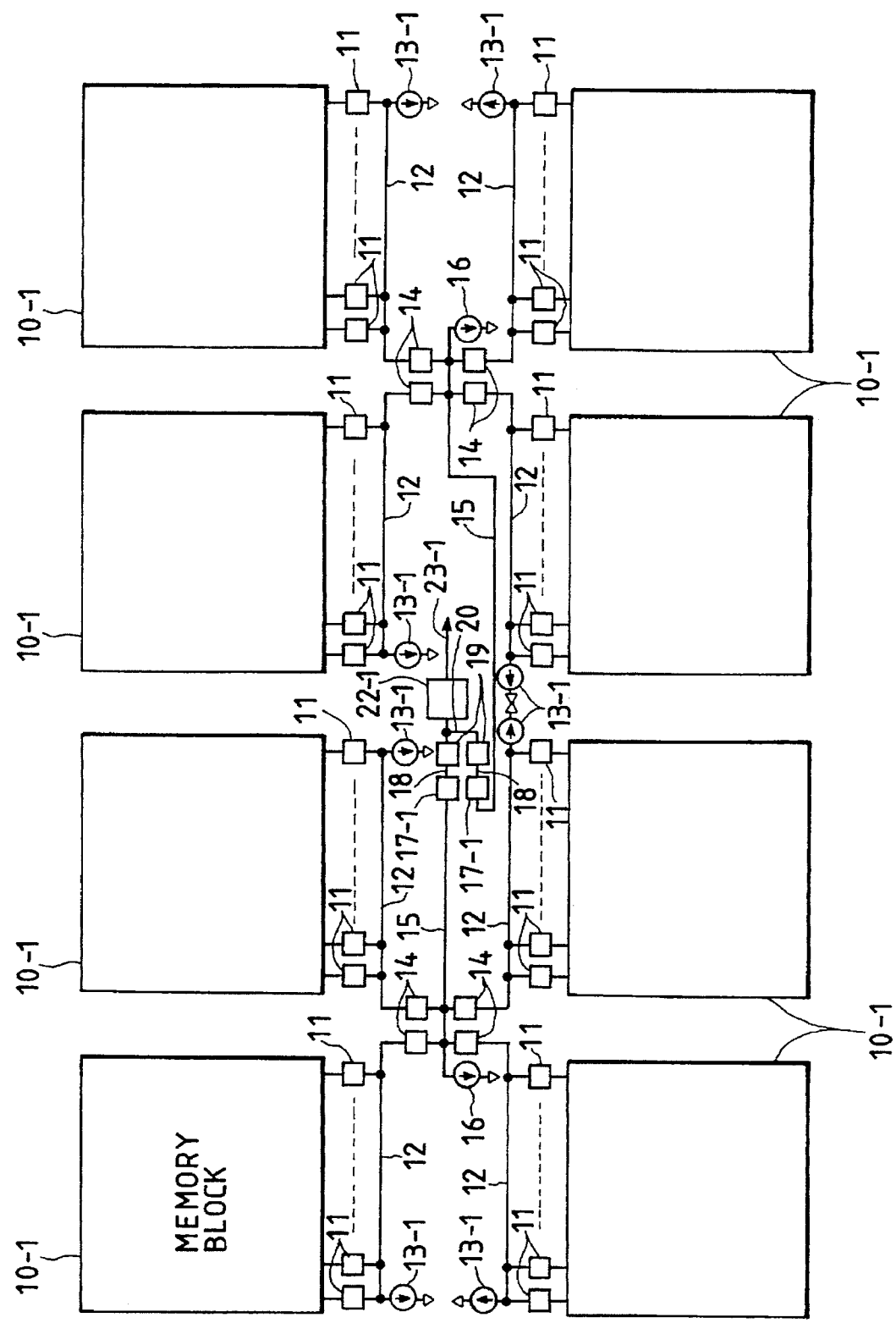
FIG. 10 is a diagram showing a main part of the whole circuit composition of an embodiment of a semiconductor memory device by the present invention.
Figure 11:
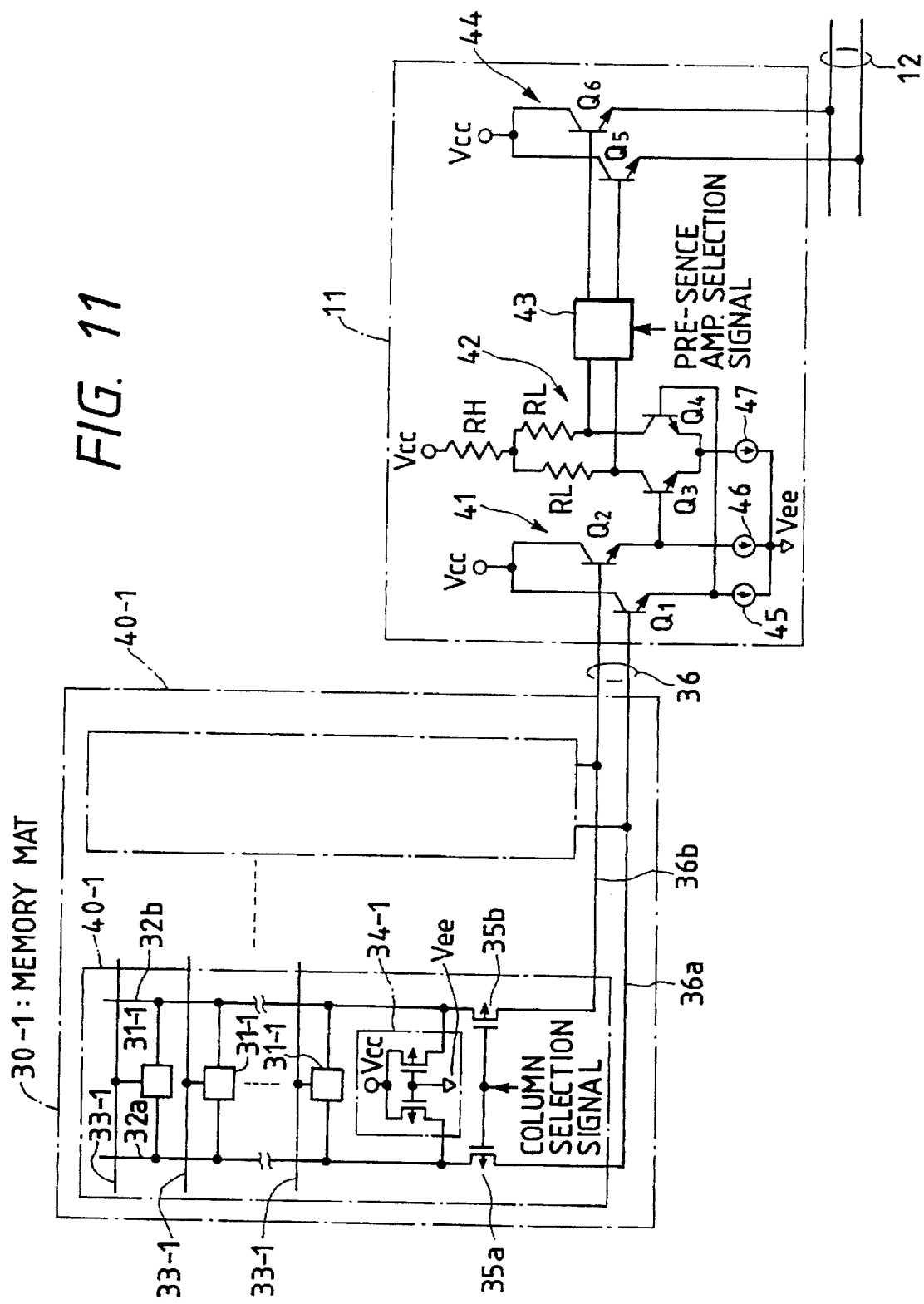
FIG. 11 is a detailed diagram of a pair of a memory mat and a pre-sense amplifier by the present invention.

As to an embodiment of the sense circuit of a semiconductor memory device, a composition of the embodiment is shown by centering the sense circuit. FIG. 9 shows a constitution of the sense circuit, being a feature part of the present invention, and FIG. 10 shows an outline of the sense circuit of the semiconductor memory device, and FIG. 11 shows a constitution of a semiconductor memory mat and a pre-sense amplifier. Those figures show only parts corresponding to one bit of a data bus, parts corresponding to the other bits are the same as the above-mentioned part. Although the output signals from a memory cell are a pair of complementary signals (H, L), as shown by FIGS. 9 and 11, FIG. 10 is drawn by single line.

As shown in FIG. 10, the memory cells of the number corresponding to the memory capacity are divided into plural memory blocks 10-1 (8 blocks are shown in the figure.) of a rectangular region, and symmetrically arranged on a semiconductor chip. Each of the memory blocks 10-1 is further divided into a plurality of (for example, 16) memory mats 30-1 of a composition shown by FIG. 11. And each of the memory mats 30-1 is divided into a plurality of (for example, 8) columns 40. Further, each of columns 40 includes a plurality of (for example, 1024) memory cells 31-1.

As shown in FIG. 10, the pre-sense amplifiers 11 of the number corresponding to the number of memory mats 30-1 are provided at the side of the central line of the memory chip. outputs of each pre-sense amplifier 11 are commonly connected the first stage of a common line (common emitter line) 12. The first stage of the common line 12 is connected to a low voltage power source Vee via a current source 13-1 and to the second stage of a common line 15 via the first emitter follower.

The second stage of the common line (common emitter line) 15 is connected to a low voltage power source Vee via a current source 16 and to the third stage of a common line (common emitter line) 20 via a shift-up circuit 17-1 and the second emitter follower.

The third stage of the common line 20 is connected to a low voltage power source Vee via a current source 21 and to the sense amplifier 22-1. The output of the sense amplifier 22-1 is connected to an output buffer via a corresponding bit line 23-1 of the data bus.

A detailed constitution of each one of the embodiment is explained along with the data reading out process of memory cells, for example, in the case of SRAM.

The memory cell 31-1 is composed of a flip-flop and a transfer gate. The output terminals of the plural memory cells contained in the column 40-1 are a pair of data lines 32a and 32b as shown in FIG. 11. A selection signal is input to each memory cell via a word line WL 33-1. A load circuit 34-1 is connected to the data lines 32a and 32b which are connected to common lines (common data lines) 36a and 36b via column selection switches 35a and 35b. the data lines 32a and 32b of a plurality of column 40-1 (8 in the embodiment) are commonly connected to the column selection switches 36a and 36b. Then, the memory contents of the specified memory cell by the word line 33-1 and the selection signal input from the column selection switches are output to the common lines 36a and 36b via the data line 32a and 32b which executes the wired-OR-logic operation of the signals on the data lines 32a and 32b from the plurality of column.

The pre-sense amplifier 11 is a conventional one, and the complementary signals H and L sent from the common lines 36a and 36b are input to a current switch 42 via an input emitter follower and amplified, respectively, and output to the common lines 12a and 12b via a base voltage control circuit 43 and an output emitter follower 44. Collectors of bipolar transistors Q1 and Q2 composing the input emitter follower 41 are connected to a high voltage power source Vcc, their emitters to bases of bipolar transistors Q3 and Q4 composing the current switch 42. The emitters of the transistors Q1 and Q2 are connected to Vee via current sources 45 and 46. In the emitter follower 41, the levels of the complementary signals H and L are shifted down by 1 Vbe in order to prevent the current switch 42 of ECL from being saturated by the signals H and L.

The outputs from the collectors of bipolar transistors Q3 and Q4 are connected to the base voltage control circuit 43, and to the Vcc via resistances RL and RH. Further, the emitters of the transistors Q1 and Q2 are commonly connected and to the Vee via a current source 47.

The base voltage control circuit 43 sends the intact outputs of the current switch 42 to the bases of the bipolar transistors Q5 and Q6 composing the output emitter follower 44 if the pre-sense amplifier is of the selection state. Then, the control circuit 43 sends signals sufficiently lower than the levels of the output signals of the current switch 42 if the pre-sense amplifier is of the non-selection state.

Collectors of the transistors Q5 and Q6 of the output emitter follower 44 are connected to the Vcc. The emitters of the transistors Q5 and Q6 are connected to the first stage of common lines 12a and 12b, respectively, which are connected to the Vcc via current sources 13a and 13b. Although the current switch 42 is composed of the bipolar transistors, MOS transistors are also applicable.

The first stage of common lines 12a and 12b are provided for each memory block 10-1 which execute the wired-OR-logic operation of output signals from the pre-sense amplifiers to each memory block 10-1.

As shown in FIG. 9, the first stage of common lines are connected to the second stage common lines 15a and 15b by each group of a plurality of the predetermined grouped memory blocks, via the first emitter follower 14 as a data transfer device. In the first emitter follower 14 composed of a pair of bipolar transistors Q7 and Q8 corresponding to the a pair of complementary signals, their collectors are connected to the Vcc, and their emitters to the second stage of common lines 15a and 15b which are connected to the Vee via current sources 16a and 16b. And the first stage of common lines 12a and 12b for the other memory blocks 10-1 are connected to the second stage of common lines 15a and 15b via the emitter follower 14. Then, the wired-OR-logic operation of the outputs of the plural emitter followers 14 connected to the common lines 15a and 15b is carried out. By the emitter followers 14, the first stage of common lines 12a and 12b, and the second stage of the common lines 15a and 15b, are separated, and a resistance R and a parasitic capacitance C of wiring affecting on the signal delay can be reduced.

In the following, a shift-up circuit 17-1 is explained. The shift-up circuit 17-1 is a circuit for raising the levels of signals on the pair of common lines 15a and 15b, respectively. Then, the common line 15a is connected to a cathode of the serial connection diodes of D11 and D12, and the common line 15b to a cathode of the serial connection diodes of D21 and D22. And their anodes are connected to the Vcc via current sources 24a and 24b. Further, the number of the serial connection diodes is not restricted to 2 and adequately decided. Then, the necessary number of diodes can be connected in series since the rased level corresponds to summation of each forward voltage drop of the serially connected diodes. Further, the levels up of the signals are not realized only by diodes but also by a bipolar transistors of which a base and a collector are connected, that is, by diode connection.

The output signals 18-1 and 18-2 of the sift-up circuit 17 are connected to the third stage of common lines 20a and 20b via an emitter follower composed of the bipolar transistors Q9 and Q10, as shown by FIG. 9. To the third stage of common lines 20a and 20b, signals of which the levels are raised by the other shift-up circuits not shown in the figure, are output via the second emitter follower 19. Then, the third stage of common lines 20a and 20b execute the wired-OR-logic operation of the output signals of the emitter followers 19. And it is the final stage of wired-OR-logic operation in the embodiment.

Then, the pair of complementary signals of which the final stage of wired-OR-logic is carried out, are input to bases of bipolar transistors Q11 and Q12 composing a sense amplifier 22-1. The collectors of the transistors Q11 and Q12 are connected to the Vcc via resistances R1 and R2, and the emitters to the Vee via a current source 25-1.

Figure 12:
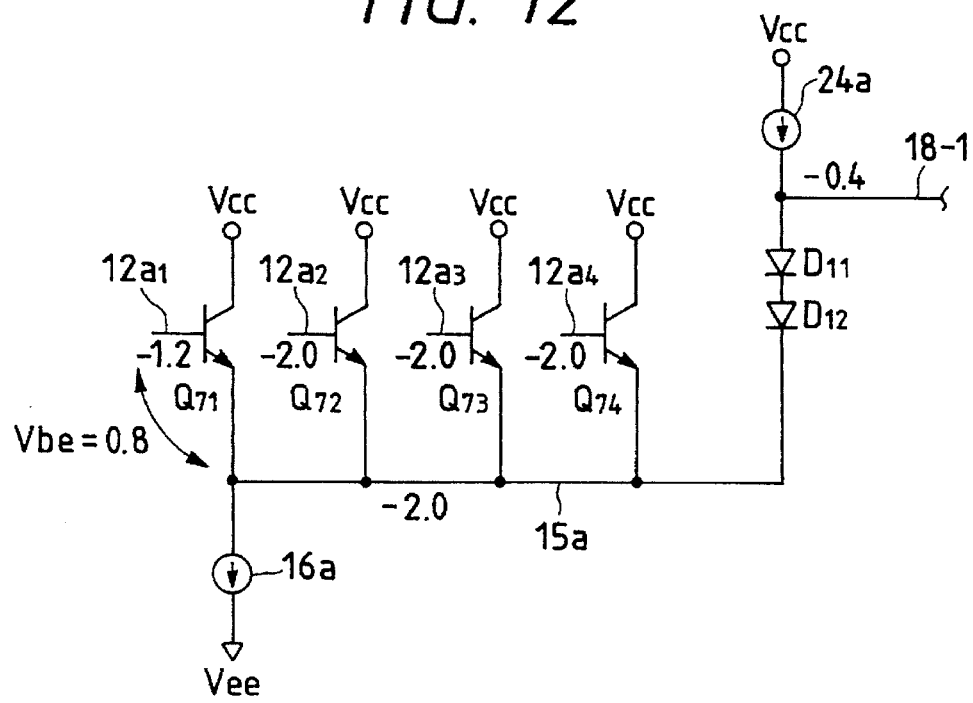
FIG. 12 is a figure for explaining the operations of an emitter follower and a shift-up circuit of a distinctive part of the embodiment shown by FIG. 9.

Operations of the embodiment having the above-mentioned composition are explained by centering a feature part of the shift-up circuit, referring to FIG. 12. For simplicity of explanation, operations of a composition as shown by FIG. 12 is described as follows. The common line 15a executes the wired-OR-logic operation of four common line 12a ($12a_1$, $12a_2$, $12a_3$, $12a_4$), each of which executes the wired-OR-logic operation of 16 output signals from the sixteen pre-sense amplifiers, and the outputs of the wired-OR-logic operation are shifted up by the shift-up circuit 17 composed of D11 and D12.

Now, it is assumed that Vcc=0 V and Vee=−3.3, and the pre-sense amplifier 11 connected to the common line $12a_1$ is selected. Further, it is assumed that the output voltage of the emitter follower 44 connected to the selected pre-sense amplifier 11 becomes, for example, −1.2 V (or −1.5 V) and the output voltages of the emitter followers connected to the non-selected pre-sense amplifiers 11 are 2.0 V. The emitter follower transistors Q71–Q74 are commonly connected to the common line, and the transistor Q71 having the highest base voltage becomes of the ON state. Therefore, the emitter voltage of the common line 15a becomes −2.0 V which is the value reduced from the base voltage −1.2 V by Vbe (=0.8 V). On the contrary, the transistors Q72–Q74 connected to the non-selected PSAs are not turned on since the base voltages of the transistors are the same potential of −2.0 as the emitter voltages. And only the output $12a_1$ of the output emitter follower 44 connected to the selected pre-sense amplifier 11 is led out to the common line 15a, and then the wired-OR-logic of the four signals of the common lines $12a_1$–$12a_4$ is operated.

If the wired-OR-logic of the signals of 15a (−2.0) is operated by the emitter follower 19 and the signals of the common line 20 are input to the base of the bipolar transistor Q11 of ECL current switch composing the sense amplifier 22-1, the sense 22-1 can not be operated since the voltage between the base and the Vee is only 0.5 V. It is because, since the voltage decrease Vbe between the base and the emitter of the current switch is 0.8 V and the lowest operational voltage of the current source connected to the emitter of the current switch is 0.4, the lowest operational voltage of ECL current switch is 1.2.

Therefore, in the embodiment, the signal voltages of the common line 15a is raised by the shift-up circuit 17-1 composed of diodes D11 and D12. That is, since the diodes D11 and D12 are turned on via the path of Vcc→ a current source 24a → the current source 16a → Vee, the signal voltage at the anode side is raised to the −0.4 V of level higher than the signal voltage of the common line 15a by 2×Vd (=2×0.8) of the forward voltage decrease of two pieces of diodes. Namely, the signal voltage is raised by Vd× the number of serially connected diodes and output toe the common line 18-1.

Further, the wired-OR-logic of the signal output to the common line 18-1 and the other signals output to the common line 18-1 is operated. The signals of the common lines not including the selected pre-sense amplifier are investigated. Then, in FIG. 12, all the signal voltages input to the bases of the transistors Q71–Q74 are −2.0 V. If the voltage decrease of the current source 16a is more than 0.4 V, the emitter voltage (15a) is −2.9 V, and the voltage becomes only 0.7 V lower than the voltage decrease between the base and the emitter of the transistors Q71–Q74. Then, the current fractionally flows into the transistors Q71–Q74 corresponding to the source current 16a and the voltage of the common line 15a becomes −2.9 V. Since the signal of −2.9 V becomes only −1.3 V even if the signal is raised by the shift-up circuit 17-1, the level of the signals can be kept sufficiently lower than the −0.4 V of signal voltage of the common line 18-1 connected to the selected pre-sense amplifier 11. That is, since the signals of the common line are raised as keeping the relative relation of the levels of the input signals, only the signal of the common line 18-1 connected to the selected pre-sense amplifier 11 can be output by executing the wired-OR-logic operation of the signals of the common lines via the emitter follower 19.

Figure 13:
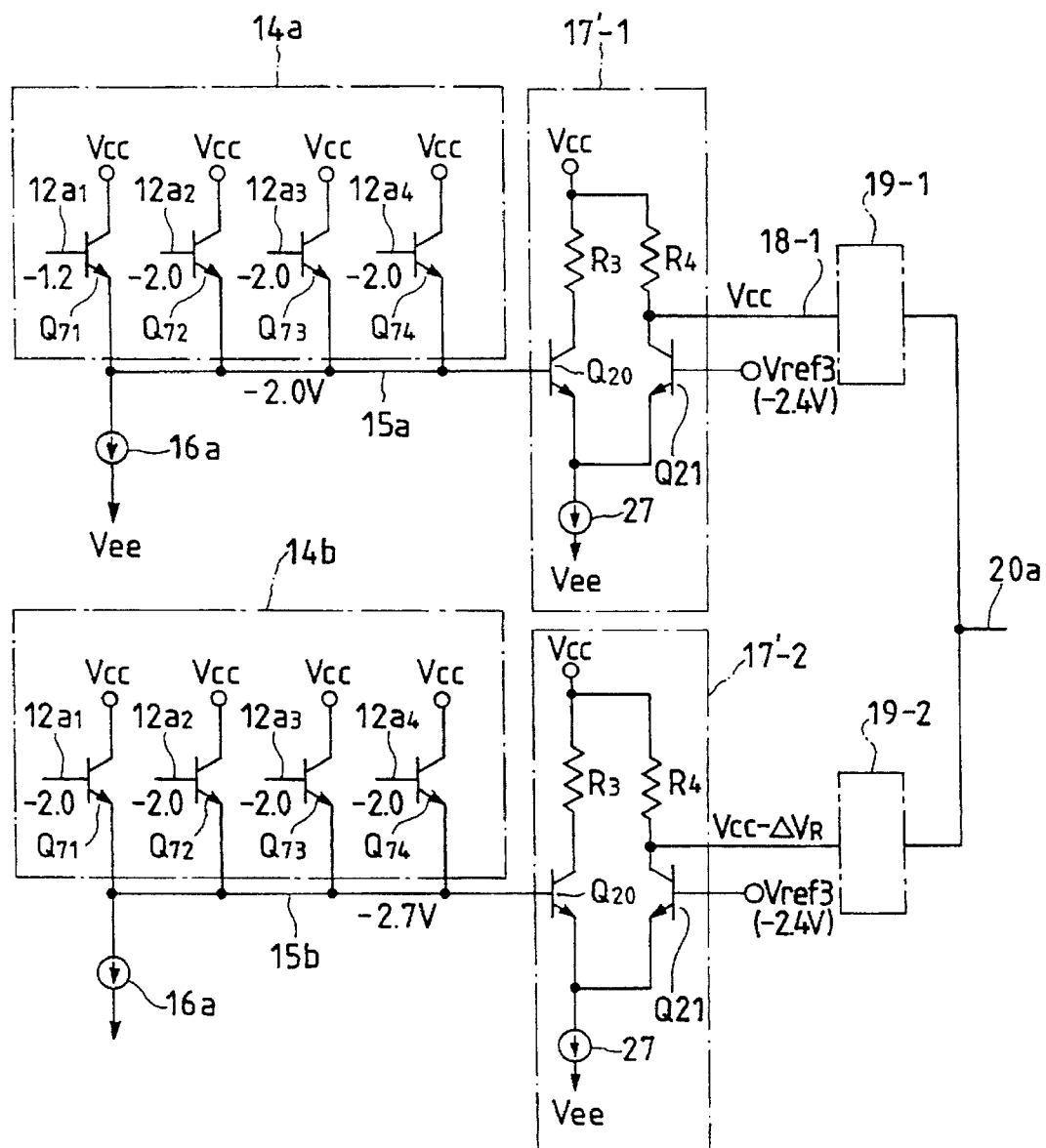
FIG. 13 is a figure for explaining the operations of a shift-up circuit by using a current switch.

On the other hand, since the relative relation of the levels of input signals is lost if a current switch is used as a shift-up circuit, the signal of the common line connected to the selected pre-sense amplifier can not be output even if the wired-OR-logic of the sifted up signals is intactly operated. This problem is explained referring to FIG. 13 in the following. In FIG. 13, is shown an example wherein the wired-OR-logic operation of the output signal of the wired-OR-logic operation of the output signals of the four memory cell blocks via the emitter follower group 14a shown by FIG. 12, and the output signal of the wired-OR-logic operation of the output signals of the other four memory cell blocks via the emitter follower group 14b shown, is executed. As shown in the figure, in place of the shift-up circuit 17-1, current switches 17'-1 and 17' including a pair of bipolar transistors Q20 and Q21 are applied. Collectors of transistors Q20 and Q21 are connected to the Vcc via resistances R3 and R4, respectively, and emitters to the Vee via an emitter current source 27. And an output signal is output from each collector of each Q21. As well as the case shown by FIG. 12, the output signal from the selected pre-sense amplifier 11 is input to the base of the transistor Q71 of the emitter follower group 14a. The voltage of the output signal of the common line 15a connected to the emitter follower group 14a is −2.0 as mentioned previously. On the contrary, the voltage of the output signal of the common line 15b connected to the emitter follower group 14b is −2.7 V. When those signals are input to bases of the current switches 17'-1 and 17'-2, the voltages of collector outputs 18-1 and 18-2 become 0 V (=Vcc), (Vcc−ΔVr) V, respectively, where ΔVr is the voltage decrease at the resistance R4. Then, if the current of the current source 27 is 0.3 mA and the resistance value of R4 is 1 kΩ, ΔVr is 0.3 V and the voltage difference (0.7 V) between the levels of the common lines 15a and 15b is lost. And the outputs of the current switches 17'-1 and 17'-2 do not keep the relative relation of the levels of the input signals. Therefore, operating the wired-OR-logic of the output signals via the next stage of emitter followers 19-1 and 19-2 is meaningless.

In the embodiment by the present invention, if the current flowing the diodes of the shift-up circuit 17-1 becomes large, the potential of the common lines of the former stage is shifted up and the correct voltage levels of the input signals can not be kept. Therefore, it is important to set the preset value of a current I1 of the current sources 24a and 24b sufficiently lower than that of a current I2 of the current sources 16a and 16b of the former stage of common lines. For example, the current I1 is set less than one half, preferably near to one sixth, of the current I2. Then, since the current sources 24a and 24b also operate as a source for charging the parasitic capacitances of the common lines 18-1 and 18-2, the preset value of the current I1 is needed to have the value enough to charge the capacitance quickly.

As explained above, by the embodiment, in operating the wired-OR-logic of the outputs of each stage via each emitter follower provided between the two stages, by dividing the outputs of the pre-sense amplifiers into the hierarchical and multi-stage groups, the signal levels decreased by the emitter followers are raised by the shift-up circuits mainly composed of the diodes. Therefore, even if the output signal level of the wired-OR-logic decreases under the lowest operational voltage of the transistors of the next stage or the final stage, a sense circuit can be certainly operated.

Then, since the wired-OR-logic of the output signals divided into any number of multi-stages can be operated, the parasitic capacitances and the resistances of wiring can be effectively reduced, which realizes a high-speed access of memory cells by decreasing the RC delay.

Further, by the shift-up circuit of the embodiment, since the signal levels can be raised as keeping the relative relation of the levels of input signals, the wired-OR-logic of output signals of the former stage can be operated via the emitter follower intactly, which makes the composition of a sense circuit simple.

Further, even if the voltage of a power source is decreased (for example, 2.0 V) for reducing power consumption, the memory access time is highly shortened by dividing the data bus lines into the multi-stage groups.

Further, by adopting a sense circuit of the embodiment, the access time of reading out memory cells of a semiconductor memory device is shortened and the voltage of a power source can be reduced.

Figure 14:
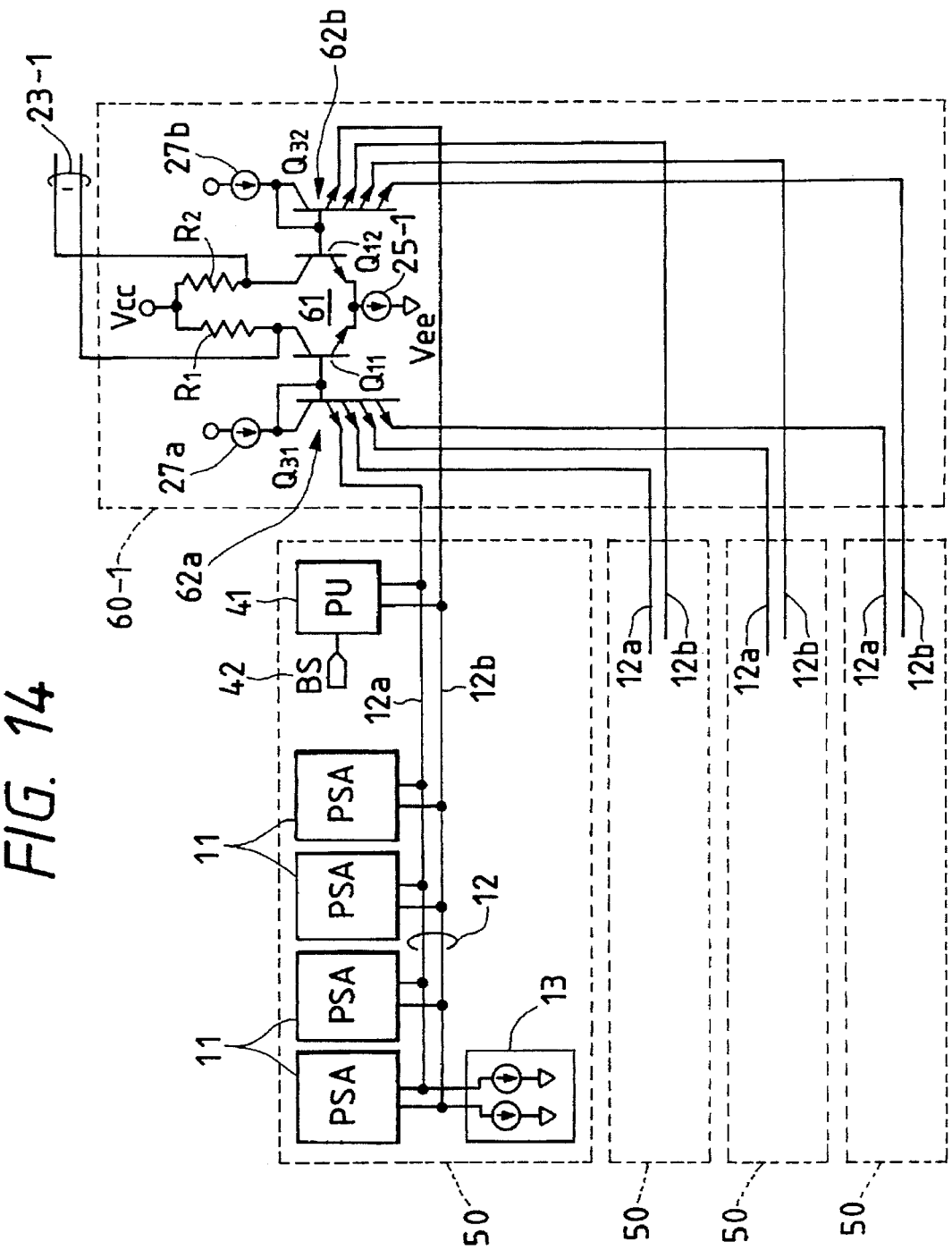
FIG. 14 is a diagram showing a circuit composition of another embodiment of a sense circuit by the present invention.

FIG. 14 is a diagram showing a constitution of another embodiment of a sense circuit by the present invention.

The embodiment mainly aims at providing a sense circuit corresponding to lower the voltage of a power source. As shown by the figure, plural pre-sense amplifiers 11 are divided in to a plurality of blocks 50, and the outputs of each of the blocks are connected to a pair of common lines 12a and 12b (common emitter lines) which are input to multi-emitters of transistors Q31 and Q32, and a pull-up circuit 41 and current sources 13 are connected to the common lines 12a and 12b. And one main sense amplifier 60-1 is provided to the plurality of blocks 50.

The composition of the pre-sense amplifiers 11 is the same as that shown by FIG. 11. The pull-up circuit 41 is controlled by a block selection signal BS (H level in the selected state and L level in the non-selected state), and the voltage of the common lines 12 are raised to Vcc by shorting the common lines to the Vcc in the selected state, and the connection between the common lines and the Vcc is opened.

The main sense amplifier 60-1 includes a current switch 61 and shift-up circuits 62a and 62b. Collectors of the current switch composed of bipolar transistors Q11 and Q12 are connected to the Vcc via resistances R1 and R2, and emitters of the current switch 61 to the Vee via a current source 25-1, and the voltages of the collectors are output as output signals 23-1 to an output buffer. And, in the shift-up circuits 62a and 62b including multi-emitter transistors Q31 and Q32, a collector and a base of each transistor are commonly connected to the Vcc via current sources 27a and 27b, and multi-emitters of each transistor are connected to the common lines 12a and 12b, respectively.

The operations of the embodiment having the above-mentioned composition are explained referring to voltage changes of each part shown in FIG. 15 in the following.

Although a pair of complementary signals (H, L) are actually dealt with in the sense circuit, behaviors of the low level signal L are explained for simple explanation. In FIGS. 11 and 15, the level of the signal L input to the pre-sense amplifier 11 is reduced by the amplitude between the complementary signals (H–L=less than 50 mV). Then, the level of the signal L input to ECL current switch 42 is reduced to the level of (Vcc–(1×Vbe+50 mV)) shifted down by Vbe (for example, 0.8 V) in the input emitter follower. The level of the emitter voltage of ECL current switch 42 is reduced to the level decreased by 2×Vbe from Vcc. Now letting Vbe 0.8 V and the lowest operational voltage 0.4, the pre-sense amplifier 11 can operate with the power voltage (Vcc–Vee) of more than 2.0 V. As to outputs of the current switch 42, the level of the signal H is reduced about by 0.4 V by a resistance RL and the level of the signal L is further reduced by the amplitude by a resistance RL (for example, 0.3 V). That is, the level of the output signal L of the current switch 42 becomes (Vcc–0.7 V). The wired-OR-logic of the output signals of the current switch 42 is operated in the common lines 12 via the output followers 44. Although the level of the signal L becomes the level reduced by 1.5 V (=0.7 V+0.8 V) from Vcc, the emitter follower certainly operates since the voltage of 0.5 V is applied to the common lines 12 by the current sources 16. Since the common lines 12 operates independently in each block 50, the level of the signal L of only the selected block 50 becomes the level reduced by 1.5 V from Vcc, and the level of the signal L of the non-selected block 50 becomes Vcc. The signals of the common lines 12 of each block 50 are input to the respective emitter nodes of each one of the multi-emitter transistors Q31 and Q32.

The level of each base node of the multi-emitter transistors Q31 and Q32 becomes the level raised by 1 Vbe from the lowest level of the voltages at the plural emitter nodes (namely, the signal level of the common lines of the selected block 50). It is because the path between the base node and the other higher level emitter node having the level lower than 1 Vbe is turned off. Since the level of the signals of the common lines 12 connected to the selected block 50 are raised by 1 Vbe and the raised level is high enough to operate the current switch 61, the signals are amplified and output to the output buffer. That is, the input level of the signal H of the current switch 61 is decreased by 0.4 V from Vcc and the level of the emitter node of the current switch 61 is decreased by 1.2 V from Vcc. Therefore, the current switch certainly operates since the voltage of 0.8 V is applied to the current source 25.

As explained above, by the embodiment, it is possible to realize a sense circuit capable of certainly operating by the power voltage of 2.0 V.

Further, it is also possible to combine the above-mentioned embodiments.

Further, since the levels of the pairs of complementary signals on common lines are shifted up as keeping the relative relations of the levels of the complementary signals, it is possible to operate the wired-OR-logic of the shifted up signals. Then, since the composition of data bus lines of a sense circuit can be made as a hierarchical and multi-stage composition, it is possible considerably to reduce the RC delay of wiring.

Further, since the selected common lines can be directly specified or identified by combining shift-up circuits to which a multi-emitter transistor is applied and pull-up circuits, the multi-stage division of data bus lines and a low voltage power source (for example, about 2.0 V) can be simultaneously realized.

By the above-mentioned features of the present invention, the multi-bit test becomes possible and further a sense circuit suitable to a memory device can be offered, which make it possible to realize a large capacity, high speed and high performance memory device.

What is claimed is:

1. A logic gate circuit, comprising: a plurality of bus lines to each of which a plurality of logic signals are input, a level shift circuit including a diode device having a plurality of inputs and one output and a pull-up current source connected to said output; and a level comparing circuit of a differential circuit including two inputs, to one of which a reference voltage is fed; wherein said plurality of inputs of said diode device of said level shift circuit are connected to at least two of said plurality of bus lines, wherein said level shift circuit operates to raise the level of one of the logic signals having the lowest voltage level of said plurality of logic signals, wherein said other input of said differential circuit of said level comparing circuit is connected to said output of said diode device, and wherein AND logic of said logic signals input to at least two of said plurality of bus lines is operated and led out to said output of said differential circuit.

2. A logic gate circuit according to claim 1, wherein said diode device is a multi-emitter transistor of diode connection, of which a base and a collector are commonly connected.

3. A logic gate circuit according to claim 1, wherein said diode device comprises a combination of plural diodes of which anodes are commonly connected.

4. A logic gate circuit according to claim 1, wherein said differential circuit is a differential connection transistor circuit.

5. A parallel test circuit of memory cells, comprising: a memory cell array; a plurality of column switches for selecting a specific memory cell of said memory cell array and outputting information memorized in said selected memory cell to common bit lines; a plurality of pre-sense amplifiers outputting said information output to said common bit lines to a pair of common data bus lines; a main sense amplifier connected to said pair of common data bus lines; and a test circuit connected to said pair of common data bus lines;, wherein said test circuit has a level shift circuit including a diode device having two inputs and one output and a pull-up current source connected to said output and a level comparing circuit of a differential circuit including two inputs, to one of which a reference voltage is fed, said two inputs of said diode device of said level shift circuit are respectively connected to said pair of common data bus lines, said other input of said differential circuit of said level comparing circuit is connected to said output of said diode device, and AND logic of two logic signals input to said pair of common data bus lines is operated and led out to said output of said differential circuit.

6. A parallel test circuit of memory cells according to claim 5, wherein said main sense amplifier comprises a level shift circuit including a first diode device and a second diode device, each of which has two inputs and two outputs, and two pull-up current sources, and further another differential circuit besides said differential circuit described in claim 5, having two inputs, said two inputs of each one of said two diode devices of said level shift circuit being connected to said pair of common data bus, respectively, said two inputs of said another differential circuit being connected to two outputs of said second diode device, and logic signals being led out from two outputs of said differential circuits after raising levels of logic signals input to said pair of common data bus lines.

7. A parallel test circuit of memory cells according to claim 6, wherein said another differential circuit and said level comparing circuit are driven by a signal for selecting one of an operation state and a non-operation state.

8. A parallel test circuit of memory cells according to one of claims 5 to 7, wherein, in each of said diode devices, a multi-emitter transistor of diode connection, of which a base and a collector are commonly connected, is used.

9. A parallel test circuit of memory cells according to one of claims 5 to 7, wherein each of said diode devices comprises a combination of plural diodes of which anodes are commonly connected.

10. A parallel test circuit of memory cells according to one of claims 5 to 7, wherein said differential circuit is a differential connection transistor circuit.

11. A logic gate circuit according to one of claims 1 to 4, wherein said plurality of bus lines are address bus lines, said level shift circuit and said level comparing circuit corresponds to a pre-decoder circuit, and said whole logic gate circuit composes a decoder circuit.

12. A logic gate circuit comprising: a plurality of bus lines to each of which a plurality of logic signals are input, a level shift circuit including a diode device having a plurality of inputs and one output and a pull-up current source connected to said output; and a level comparing circuit of a differential circuit including two inputs, to one of which a reference voltage is fed; wherein said plurality of inputs of said diode device of said level shift circuit are connected to at least two of said plurality of bus lines, wherein said other input of said differential circuit of said level comparing circuit is connected to said output of said diode device, and AND logic of said logic signals input to at least two of said plurality of bus lines is operated and led out to said output of said differential circuit, wherein the plurality of bus lines are common data bus lines of a memory cell array, and wherein the logic gate circuit is formed as a part of a parallel test circuit for memory cells of the memory cell array.

13. A parallel test circuit for memory cells of a memory cell array, wherein the memory cells are coupled to a plurality of bus lines to provide information to the plurality of bus lines, wherein the parallel test circuit includes a level shift circuit including a diode device having a plurality of inputs and one output and a pull-up current source connected to said output; and a level comparing circuit of a differential circuit including two inputs, to one of which a reference voltage is fed; wherein said plurality of inputs of said diode device of said level shift circuit are connected to at least two of said plurality of bus lines, wherein said level shift circuit operates to raise the level of one of the logic signals having the lowest voltage level of said plurality of logic signals, wherein said other input of said differential circuit of said level comparing circuit is connected to said output of said diode device, and wherein AND logic of logic signals input to at least two of said plurality of bus lines is operated and led out to said output of said differential circuit.

14. A logic gate circuit according to claim 2, wherein said plurality of inputs of said diode device comprise emitters of the multi-emitter transistor.

15. A parallel test circuit according to claim 13, wherein said diode device is a multi-emitter transistor of diode connection, of which a base and a collector are commonly connected.

16. A parallel test circuit according to claim 15, wherein said plurality of inputs of said diode device comprise emitters of the multi-emitter transistor.

17. A logic gate circuit for operating with a power source voltage of 2.5 volts or less, comprising: a plurality of bus lines to each of which a plurality of logic signals are input, a level shift circuit including a diode device having a plurality of inputs and one output and a pull-up current source connected to said output; a level comparing circuit of a differential circuit including two inputs, to one of which a reference voltage is fed and power supply means for supplying power to said logic gate circuit; wherein said plurality of inputs of said diode device of said level shift circuit are connected to at least two of said plurality of bus lines, wherein said level shift circuit operates to raise the level of one of the logic signals having the lowest voltage level of said plurality of logic signals, wherein said other input of said differential circuit of said level comparing circuit is connected to said output of said diode device, wherein AND logic of logic signals input to at least two of said plurality of bus lines is operated and led out to said output of said differential circuit, and wherein said power supply means supplies a power supply voltage of less than 2.5 volts for at least a portion of time during which power is supplied to said logic gate circuit.

18. A logic gate circuit according to claim 17, wherein said diode device is a multi-emitter transistor of diode connection, of which a base and a collector are commonly connected.

19. A logic gate circuit according to claim 18, wherein said plurality of inputs of said diode device comprise emitters of the multi-emitter transistor.

* * * * *